(12) United States Patent
Rosenblum et al.

(10) Patent No.: US 11,449,384 B2
(45) Date of Patent: Sep. 20, 2022

(54) HARDWARE-EFFICIENT FAULT-TOLERANT OPERATIONS WITH SUPERCONDUCTING CIRCUITS

(71) Applicant: Yale University, New Haven, CT (US)

(72) Inventors: Serge Rosenblum, New Haven, CT (US); Philip Reinhold, New Haven, CT (US); Liang Jiang, Guilford, CT (US); Steven M. Girvin, Hamden, CT (US); Luigi Frunzio, North Haven, CT (US); Michel Devoret, New Haven, CT (US); Robert J. Schoelkopf, III, Madison, CT (US)

(73) Assignee: Yale University, New Haven, CT (US)

( * ) Notice: Subject to any disclaimer, the term of this patent is extended or adjusted under 35 U.S.C. 154(b) by 242 days.

(21) Appl. No.: 16/959,251

(22) PCT Filed: Jan. 5, 2019

(86) PCT No.: PCT/US2019/012441
§ 371 (c)(1),
(2) Date: Jun. 30, 2020

(87) PCT Pub. No.: WO2019/156760
PCT Pub. Date: Aug. 15, 2019

(65) Prior Publication Data
US 2020/0334104 A1     Oct. 22, 2020

Related U.S. Application Data

(60) Provisional application No. 62/733,316, filed on Sep. 19, 2018, provisional application No. 62/613,974, filed on Jan. 5, 2018.

(51) Int. Cl.
*G06F 11/10*     (2006.01)
*G06N 10/00*     (2022.01)
(Continued)

(52) U.S. Cl.
CPC ......... *G06F 11/1004* (2013.01); *G06N 10/00* (2019.01); *H03K 19/003* (2013.01); *H03K 19/195* (2013.01)

(58) Field of Classification Search
CPC .. G06F 11/1004; G06N 10/00; H03K 19/003; H03K 19/195
See application file for complete search history.

(56) References Cited

U.S. PATENT DOCUMENTS 5,635,834 A     6/1997 Sloggett et al.
7,135,701 B2    11/2006 Amin et al.
(Continued)

FOREIGN PATENT DOCUMENTS

CN     101548288 A     9/2009
CN     103246017 A     8/2013
(Continued)

OTHER PUBLICATIONS

Hornibrook et al., Cryogenic control architecture for large-scale quantum computing. Physical Review Applied. Feb. 23, 2015;3(2):024010.
(Continued)

*Primary Examiner* — Kurtis R Bahr
(74) *Attorney, Agent, or Firm* — Wolf, Greenfield & Sacks, P.C.

(57) ABSTRACT

Techniques for providing hardware-efficient fault-tolerant quantum operations are provided. In some aspects a cavity and an ancilla transmon are used to implement a quantum operation by encoding a logical qubit using more than two energy levels of the cavity, encoding information using more than two energy levels of the ancilla transmon, and creating an interaction between the cavity and the ancilla transmon that decouples at least one error type in the ancilla transmon from the cavity.

20 Claims, 16 Drawing Sheets

(51) Int. Cl.
  H03K 19/003   (2006.01)
  H03K 19/195   (2006.01)

(56) References Cited

U.S. PATENT DOCUMENTS

| | | | |
|---|---|---|---|
| 7,307,275 | B2 | 12/2007 | Lidar et al. |
| 7,616,452 | B2 | 11/2009 | Wehrly, Jr. et al. |
| 7,791,780 | B2 | 9/2010 | Munro et al. |
| 7,966,549 | B2 | 6/2011 | Hollenberg et al. |
| 8,032,474 | B2 | 10/2011 | Macready et al. |
| 9,907,181 | B2 | 2/2018 | Kraft et al. |
| 10,127,499 | B1 | 11/2018 | Rigetti et al. |
| 2004/0059760 | A1 | 3/2004 | Ageishi et al. |
| 2007/0296953 | A1 | 12/2007 | Allen et al. |
| 2008/0185576 | A1* | 8/2008 | Hollenberg ............ G06N 10/00 257/14 |
| 2009/0241013 | A1 | 9/2009 | Roetteler |
| 2011/0060710 | A1 | 3/2011 | Amin |
| 2014/0264285 | A1 | 9/2014 | Chow et al. |
| 2014/0368234 | A1 | 12/2014 | Chow et al. |
| 2016/0071021 | A1 | 3/2016 | Raymond |
| 2016/0267032 | A1 | 9/2016 | Rigetti et al. |
| 2016/0381800 | A1 | 12/2016 | Yagnamurthy et al. |
| 2017/0062692 | A1 | 3/2017 | Dial et al. |
| 2018/0330266 | A1 | 11/2018 | Simmons et al. |
| 2019/0020346 | A1* | 1/2019 | Wang .................. H03B 5/1847 |
| 2019/0049495 | A1* | 2/2019 | Ofek .................. G01R 33/1284 |
| 2021/0125096 | A1 | 4/2021 | Puri et al. |

FOREIGN PATENT DOCUMENTS

| | | |
|---|---|---|
| CN | 105281886 A | 1/2016 |
| JP | 2010-511946 A | 4/2010 |
| JP | 2013-121161 A | 6/2013 |
| JP | 2014-523705 A | 9/2014 |
| WO | WO 2017/065856 A2 | 4/2017 |
| WO | WO 2017/123940 A1 | 7/2017 |
| WO | WO 2017/139683 A1 | 8/2017 |
| WO | WO 2017/151200 A1 | 9/2017 |
| WO | WO 2018/089850 A1 | 5/2018 |

OTHER PUBLICATIONS

U.S. Appl. No. 16/076,411, Ofek et al., Aug. 8, 2018.
U.S. Appl. No. 17/253,460, Puri et al., Dec. 17, 2020.
International Search Report and Written Opinion dated Apr. 20, 2017 in connection with International Application No. PCT/US2017/017534.
International Preliminary Report on Patentability dated Aug. 23, 2018 in connection with International Application No. PCT/US2017/017534.
Extended European Search Report for European Application No. 17750901.5, dated Oct. 2, 2019.
International Search Report and Written Opinion for International Application No. PCT/US2019/012441, dated Jul. 25, 2019.
International Preliminary Report on Patentability for International Application No. PCT/US2019/012441, dated Jul. 16, 2020.
International Search Report and Written Opinion for International Application No. PCT/US2019/039945, dated Mar. 9, 2020.
Albert et al., Pair-cat codes: autonomous error-correction with low-order nonlinearity. Quantum Science and Technology. Jul. 2019;4(3):035007.
Albert et al., Performance and structure of single-mode bosonic codes. Physical Review A. Mar. 30, 2018;97(3):032346.
Aliferis et al., Fault-tolerant computing with biased-noise superconducting qubits: a case study. New Journal of Physics. Jan. 30, 2009;11(1):013061.
Aliferis et al., Fault-tolerant quantum computation against biased noise. Physical Review A. Nov. 19, 2008;78(5):052331.
Aoki et al., Quantum error correction beyond qubits. Nat. Phys. Aug. 2009;5(8):541-6.
Barends et al., Superconducting quantum circuits at the surface code threshold for fault tolerance. Nature. Apr. 2014;508(7497):500-3.
Bergeal et al., Phase-preserving amplification near the quantum limit with a Josephson ring modulator. Nature. May 2010;465(7294):64-8.
Bermudez et al., Robust trapped-ion quantum logic gates by continuous dynamical decoupling. Physical Review A. 2012;85:9 pages.
Berry et al., How to perform the most accurate possible phase measurements. Physical Review A. Nov. 23, 2009;80(5):052114.
Berry et al., Optimal input states and feedback for interferometric phase estimation. Physical Review A. Apr. 12, 2001;63(5):053804-1-11.
Bertet et al., Direct Measurement of the Wigner Function of a One-Photon Fock State in a Cavity. Phys. Rev. Lett. Oct. 28, 2002;89(20):200402-1-4.
Blais et al., Cavity quantum electrodynamics for superconducting electrical circuits: An architecture for quantum computation. Phys. Rev. A. Jun. 29, 2004;69(6):062320.
Boissonneault et al., Nonlinear dispersive regime of cavity QED: The dressed dephasing model. Physical Review A. Jun. 17, 2008;77(6):060305.
Braunstein et al., Dense coding for continuous variables. Phys. Rev. A. Apr. 2000;61(4):042302.
Braunstein et al., Teleportation of continuous quantum variables. Phys. Rev. Lett. Jan. 26, 1998;80(4):869-72.
Braunstein, Quantum error correction for communication with linear optics. Nature. Jul. 2, 1998;394(6688):47-9.
Brecht et al., Demonstration of superconducting micromachined cavities. Applied Physics Letters. Nov. 9, 2015;107(19):192603.
Brecht et al., Multilayer microwave integrated quantum circuits for scalable quantum computing. NPJ Quantum Information. Feb. 23, 2016;2:16002.
Brooks et al., Fault-tolerant quantum computation with asymmetric Bacon-Shor codes. Physical Review A. Mar. 7, 2013;87(3):032310.
Brune et al., Quantum nondemolition measurement of small photon numbers by Rydberg-atom phase-sensitive detection. Phys. Rev. Lett. Aug. 20, 1990;65(8):976-9.
C'Orcoles et al., Demonstration of a quantum error detection code using a square lattice of four superconducting qubits. Nat. Comm. Apr. 29, 2015;6:6979.
Cahill et al., Density operators and quasiprobability distributions. Phys. Rev. Jan. 25, 1969;177(5):1882-1902.
Calderbank et al., Good quantum error-correcting codes exist. Physical Review A. Aug. 1, 1996;54(2):1098-105.
Chiaverini et al., Realization of quantum error correction. Nature. Dec. 2004;432(7017):602-5.
Chow et al., Universal quantum gate set approaching fault-tolerant thresholds with superconducting qubits. Phys. Rev. Lett. Aug. 9, 2012;109(6):060501-1-5.
Cohen et al., Degeneracy-Preserving Quantum Nondemolition Measurement of Parity-Type Observables for Cat Qubits. Physical Review Letters. Aug. 9, 2017;119(6):060503.
Cory et al., Experimental Quantum Error Correction. Phys. Rev. Lett. Sep. 7, 1998;81(10):2152-5.
Cramer et al., Repeated quantum error correction on a continuously encoded qubit by real-time feedback. Nature communications. May 5, 2016;7:11526.
De Fouquieres et al., Second order gradient ascent pulse engineering. J. Mag. Res. Oct. 1, 2011;212(2):412-7.
Deleglise et al., Reconstruction of non-classical cavity field states with snapshots of their decoherence. Nature. Sep. 25, 2008;455(7212):510-4.
Devoret et al., Superconducting Circuits for Quantum Information: An Outlook. Science. Mar. 8, 2013;339(6124):1169-74.
Divincenzo et al., Fault-Tolerant Error Correction with Efficient Quantum Codes. Physical Review Letters. Oct. 1996. 7;77(15):3260-3.
Eastin et al., Restrictions on Transversal Encoded Quantum Gate Sets. Physical Review Letters. Mar. 18, 2009;102(11):110502.
Facchi et al., Quantum zeno subspaces. Physical review letters. Aug. 19, 2002;89(8):080401-1-4.

(56) References Cited

OTHER PUBLICATIONS

Flurin et al., Superconducting quantum node for entanglement and storage of microwave radiation. Physical review letters. Mar. 4, 2015;114(9):090503.
Fowler et al., Surface codes: Towards practical large-scale quantum computation. Phys. Rev. A. 2012;86(3):032324-1-48.
Frattini et al., 3-wave mixing Josephson dipole element. Applied Physics Letters. May 29, 2017;110(22):222603-1-4.
Gambetta et al., Building logical qubits in a superconducting quantum computing system. NPJ Quantum Information. Jan. 13, 2017;3(1):2.
Gao et al., Programmable interference between two microwave quantum memories. Physical Review X. Jun. 21, 2018;8(2):021073.
Gilles et al., Generation of nonclassical light by dissipative two-photon processes. Physical Review A. Apr. 1, 1994;49(4):2785-99.
Goto, Universal quantum computation with a nonlinear oscillator network. Physical Review A. May 10, 2016;93(5):050301.
Gottesman et al., Encoding a qubit in an oscillator. Phys. Rev. A. Jun. 11, 2001;64(1):012310-1-21.
Gottesman, An introduction to quantum error correction and fault-tolerant quantum computation. In Quantum information science and its contributions to mathematics. Proceedings of Symposia in Applied Mathematics. Apr. 2010;68:13-58.
Gottesman, Quantum fault tolerance in small experiments. arXiv:1610.03507. 2016:1-8.
Gottesman, Stabilizer codes and quantum error correction. Caltech Ph.D. Thesis. 1997. 122 pages.
Gottesman, Theory of fault-tolerant quantum computation. Phys. Rev. A. Jan. 1, 1998;57(1):127-37.
Hann et al., Robust readout of bosonic qubits in the dispersive coupling regime. Physical Review A. Aug. 6, 2018;98(2):022305.
Haroche et al., Measuring the photon number parity in a cavity: from light quantum jumps to the tomography of non-classical field states. J. Mod. Opt. Sep. 10, 2007;54(13-5):2101-14.
Hatridge et al., Quantum Back-Action of an Individual Variable-Strength Measurement. Science. Jan. 11, 2013;339(6116):178-81.
Heeres et al., Cavity state manipulation using photon-number selective phase gates. Phys. Rev. Lett. Sep. 22, 2015;115(13):137002-1-5.
Hofheinz et al., Synthesizing arbitrary quantum states in a superconducting resonator. Nature. May 28, 2009; 459(7246): 546-9.
Imamog et al., Stochastic wave-function approach to non-markovian systems. Physical Review A. Nov. 1, 1994;50(5):3650.
Jensen et al., Quantum memory for entangled continuous-variable states. Nat. Phys. Jan. 2011;7(1):13.
Johansson et al., Qutip: An open-source python framework for the dynamics of open quantum systems. Computer Physics Communications. Aug. 1, 2012;183(8):1760-72.
Kapit., Error-transparent quantum gates for small logical qubit architectures. Physical Review Letters. Feb. 1, 2018;120(5):050503-1-5.
Kelly et al., State preservation by repetitive error detection in a superconducting quantum circuit. Nature. Mar. 2015;519(7541):66-9.
Khaneja et al., Optimal control of coupled spin dynamics: design of nmr pulse sequences by gradient ascent algorithms. J. Mag. Res. Feb. 1, 2005;172(2):296-305.
Kirchmair et al., Observation of quantum state collapse and revival due to the single-photon Kerr effect. Nature. Mar. 14, 2013;495(7440):205-9.
Kitaev, Fault-tolerant quantum computation by anyons. Annals of Physics. Jan. 1, 2003;303(1):2-30.
Knill et al., A scheme for efficient quantum computation with linear optics. Nature. Jan. 2001;409(6816):46-52.
Knill et al., Benchmarking quantum computers: The five-qubit error correcting code. Phys. Rev. Lett. Jun. 18, 2001;86(25):5811-4.
Knill et al., Resilient quantum computation: error models and thresholds. Proceedings of the Royal Society of London A: Mathematical, Physical and Engineering Sciences. Jan. 8, 1998;454(1969):365-84.

Leghtas et al., Confining the state of light to a quantum manifold by engineered two-photon loss. Science. Feb. 20, 2015;347(6224):853-7.
Leghtas et al., Hardware-efficient autonomous quantum memory protection. Phys. Rev. Lett. Sep. 20, 2013;111(12):120501.
Leung et al., Experimental realization of a two-bit phase damping quantum code. Phys. Rev. A. Sep. 1, 1999;60(3):1924-43.
Linke et al., Fault-tolerant quantum error detection. Science Advances. Oct. 1, 2017;3(10):e1701074.
Liu et al., Comparing and combining measurement-based and driven-dissipative entanglement stabilization. Physical Review X. Mar. 3, 2016;6(1):011022-1-18.
Lloyd et al., Analog quantum error correction. Phys. Rev. Lett. May 4, 1998;80(18):4088-91.
Lloyd et al., Quantum computation over continuous variables. Phys. Rev. Lett. Feb. 22, 1999;82(8):1784-7.
Lund et al., Fault-tolerant linear optical quantum computing with small-amplitude coherent states. Phys. Rev. Lett. Jan. 25, 2008;100(3):030503.
Lutterbach et al., Method for direct measurement of the Wigner function in cavity QED and ion traps. Phys. Rev. Lett. Mar. 31, 1997;78(13) 2547-50.
Menicucci et al., Universal Quantum Computation with Continuous-Variable Cluster States. Phys. Rev. Lett. Sep. 13, 2006;97(11):110501.
Michael et al., New class of quantum error-correcting codes for a bosonic mode. Physical Review X. Jul. 14, 2016;6(3):031006.
Minev et al., Planar multilayer circuit quantum electrodynamics. Physical Review Applied. Apr. 29, 2016;5:044021.
Mirrahimi et al., Dynamically protected cat-qubits: a new paradigm for universal quantum computation. New Journal of Physics. Apr. 22, 2014;16(4):045014.
Mirrahimi et.al., Dynamics and Control of Open Quantum Systems. Mar. 18, 2015. https://who.rocq.inria.fr/Mazyar.Mirrahimi/QuantSys2015.pdf, 98 pages.
Moussa et al., Demonstration of Sufficient Control for Two Rounds of Quantum Error Correction in a Solid State Ensemble Quantum Information Processor. Phys. Rev. Lett. Oct. 10, 2011;107(16):160501.
Nigg et al., Black-box superconducting circuit quantization. Phys. Rev. Lett. Jun. 12, 2012;108(24):240502-1-5.
Nigg et al., Quantum computations on a topologically encoded qubit. Science. 2014;345(6194):302-5.
Nigg et al., Stabilizer quantum error correction toolbox for superconducting qubits. Physical review letters. Jun. 14, 2013;110(24):243604.
Ofek et al., Demonstrating quantum error correction that extends the lifetime of quantum information. arXiv:1602.04768. Feb. 15, 2016;44 pages.
Okef et al., Extending the lifetime of a quantum bit with error correction in superconducting circuits. Nature. Aug. 25, 2016;536(7617):441-5.
Paik et al., Observation of High Coherence in Josephson Junction Qubits Measured in a Three-Dimensional Circuit QED Architecture. Phys. Rev. Lett. Dec. 5, 2011;107(24):240501.
Pfaff et al., Schrodinger's catapult: Launching multiphoton quantum states from a microwave cavity memory. Nature Physics. Jun. 5, 2017;13:882-7.
Pittman et al., Demonstration of quantum error correction using linear optics. Phys. Rev. A. May 31, 2005;71(5):052332.
Preskill, Sufficient condition on noise correlations for scalable quantum computing. Quantum Information & Computation. Mar. 2013;13(3-4):181-94.
Puri et al., Engineering the quantum states of light in a kerr-nonlinear resonator by two-photon driving. NPJ Quantum Information. Apr. 19, 2017;3(1):18.
Puri et al., Stabilized Cat in Driven Nonlinear Cavity: A Fault-Tolerant Error Syndrome Detector. arXiv:1807.09334. Jul. 24, 2018. 22 pages.
Raimond et al., Phase space tweezers for tailoring cavity fields by quantum zeno dynamics. Physical Review Letters. Nov. 16, 2010;105(21):213601.
Ralph, Continuous variable quantum cryptography. Phys. Rev. A. Dec. 8, 1999;61(1):010303.
Ralph, Quantum error correction of continuous-variable states against Gaussian noise. Phys. Rev. A. Aug. 25, 2011;84(2):022339.

(56) References Cited

OTHER PUBLICATIONS

Raussendorf et al., Fault-tolerant quantum computation with high threshold in two dimensions. Physical Review Letters. May 11, 2007;98(19):190504.
Raussendorf et al., Topological fault-tolerance in cluster state quantum computation. New Journal of Physics. Jun. 29, 2007;9(6):199.
Reagor et al., A quantum memory with near-millisecond coherence in circuit QED. Physical Review B. Jul. 8, 2016;94(1):014506-1-8.
Reed et al., Realization of three-qubit quantum error correction with superconducting circuits. Nature. Feb. 2012;482(7385):382-5.
Reiserer et al., Nondestructive Detection of an Optical Photon. Science. Dec. 13, 2013;342(6164):1349-51.
Rigetti et al., Superconducting qubit in a waveguide cavity with a coherence time approaching 0.1 ms. Physical Review B. Sep. 24, 2012;86(10):100506(R).
Riste et al., Detecting bit-flip errors in a logical qubit using stabilizer measurements. Nat. Comm. Apr. 29, 2015;6:6983.
Riste et al., Deterministic entanglement of superconducting qubits by parity measurement and feedback. Nature. Oct. 2013;502(7471):350-4.
Riste et al., Feedback control of a solid-state qubit using high-fidelity projective measurement. Phys. Rev. Lett. Dec. 10, 2012;109(24):240502.
Rosenblum et al., A CNOT gate between multiphoton qubits encoded in two cavities. Nature communications. Feb. 13, 2018;9(1):652.
Rosenblum et al., Demonstration of a fault-tolerant error syndrome measurement: results. Presentation Abstract. http://adsabs.harvard.edu/abs/2018APS..MARX15013R. APS March Meeting 2018; abstract IDS X15.013, 2 pages.
Rosenblum et al., Fault-tolerant detection of a quantum error. Science. Jul. 20, 2018;361(6399):266-70.
Sayrin et al., Real-time quantum feedback prepares and stabilizes photon number states. Nature. Sep. 2011;477(7362):73-7.
Schindler et al., Experimental Repetitive Quantum Error Correction. Science. May 27, 2011;332(6033),1059-61.
Schuster et al., Resolving photon number states in a superconducting circuit. Nature. Feb. 2007;445(7127):515-8.
Sears et al., Photon shot noise dephasing in the strong-dispersive limit of circuit QED. Phys. Rev. B. Nov. 12, 2012;86(18):180504.
Shor, Fault-tolerant quantum computation. IEEE Proceedings of 37th Annual Symposium on Foundations of Computer Science. 1996:56-65.
Shor, Scheme for reducing decoherence in quantum computer memory. Phys. Rev. A. Oct. 1, 1995 52(4):R2493-6.
Shulman et al., Suppressing qubit dephasing using real-time Hamiltonian estimation. Nat. Comm. Oct. 8, 2014;5:5156.
Steane, Error correcting codes in quantum theory. Phys. Rev. Lett. Jul. 29, 1996;77(5):793-7.
Steane, Multiple-particle interference and quantum error correction. Proc. R. Soc. Lond. A. Nov. 8, 1996;452(1954):2551-77.
Sun et al., Tracking Photon Jumps with Repeated Quantum Non-Demolition Parity Measurements. Nature. Jul. 2014;511(7510):444-8.
Taminiau et al., Universal control and error correction in multi-qubit spin registers in diamond. Nat. Nano. Mar. 2014;9(3):171-6.
Terhal et al., Encoding a qubit into a cavity mode in circuit-QED using phase estimation. Physical Review A. Jan. 11, 2016;93(1):012315.
Touzard et al., Coherent oscillations inside a quantum manifold stabilized by dissipation. Physical Review X. Apr. 4, 2018;8(2):021005.
Tuckett et al., Ultrahigh error threshold for surface codes with biased noise. Physical Review Letters. Jan. 31, 2018;120(5):050505.
Vijay et al., Observation of quantum jumps in a superconducting artificial atom. Phys. Rev. Lett. Mar. 14, 2011;106(11):110502-1-4.
Vijay et al., Stabilizing Rabi oscillations in a superconducting qubit using quantum feedback. Nature. Oct. 2012;490(7418):77-80.
Vijay et al., The Josephson bifurcation amplifier. Rev. Sci. Inst. Nov. 17, 2009;80(11):111101.
Vlastakis et al., Characterizing entanglement of an artificial atom and a cavity cat state with Bell's inequality. Nat. Comm. Nov. 27, 2015;6:8970.
Vlastakis et al., Deterministically Encoding Quantum Information Using 100-Photon Schrodinger Cat States. Science. Nov. 1, 2013;342(6158):607-10.
Vlastakis et al., Violating Bell's inequality with an artificial atom and a cat state in a cavity. arXiv:1504.02512, Apr. 2015:1-20.
Waldherr et al., Quantum error correction in a solid-state hybrid spin register. Nature. Feb. 2014;506(7487):204-7.
Wallraff et al., Strong coupling of a single photon to a superconducting qubit using circuit quantum electrodynamics. Nature. Sep. 9, 2004;431(7005):162-7.
Wang et al., A Schrodinger cat living in two boxes. Science. May 27, 2016;352(6289):1087-91.
Webster et al., Reducing the overhead for quantum computation when noise is biased. Physical Review A. Dec. 3, 2015;92(6):062309.
Wolinsky et al., Quantum noise in the parametric oscillator: from squeezed states to coherent-state superpositions. Physical Review Letters. May 2, 1988;60(18):1836-9.
Wustmann et al., Parametric resonance in tunable superconducting cavities. Physical Review B. May 1, 2013;87(18):184501.
Xue et al., Quantum filter for a class of non-Markovian quantum systems. 2015 54th IEEE Conference on Decision and Control (CDC). 2015:7096-100.
Yurke et al., Generating quantum mechanical superpositions of macroscopically distinguishable states via amplitude dispersion. Physical review letters. Jul. 7, 1986;57(1):13-6.
Zeytinoglu et al., Microwave-induced amplitude- and phase-tunable qubit-resonator coupling in circuit quantum electrodynamics. Physical Review A. Apr. 30, 2015;91(4):043846.
Extended European Search Report for European Application No. 19866408.8, dated Feb. 28, 2022.
Blumoff et al., Implementing and characterizing precise multiqubit measurements. Physical Review X. Sep. 14, 2016;6(3):031041.
Cohen, Autonomous quantum error correction with superconducting qubits. Université Paris Sciences et Lettres Doctoral Dissertation. Jun. 22, 2017:1-165.
Frattini et al., Optimizing the nonlinearity and dissipation of a snail parametric amplifier for dynamic range. Physical Review Applied. Nov. 8, 2018;10(5):054020.
Hu et al., Quantum error correction and universal gate set operation on a binomial bosonic logical qubit. Nature Physics. May 2019;15(5):503-8.
Extended European Search Report for European Application No. 19751978.8, dated Sep. 6, 2021.
Reinhold et al., Error-corrected gates on an encoded qubit. Nature Physics. Aug. 2020;16(8):822-6.
International Preliminary Report on Patentability for International Application No. PCT/US2019/039945, dated Jan. 7, 2021.

* cited by examiner

HARDWARE-EFFICIENT FAULT-TOLERANT OPERATIONS WITH SUPERCONDUCTING CIRCUITS

CROSS REFERENCE TO RELATED APPLICATIONS

This application is a national stage entry under 35 U.S.C. § 371 of international PCT Application No. PCT/US2019/012441 filed on Jan. 5, 2019, which claims the benefit under 35 U.S.C. §119(e) of U.S. Provisional Patent Application No. 62/613,974 filed Jan. 5, 2018, titled "HARDWARE-EFFICIENT FAULT-TOLERANT OPERATIONS WITH SUPERCONDUCTING CIRCUITS," and U.S. Provisional Patent Application No. 62/733,316 filed Sept. 19, 2018, titled "HARDWARE-EFFICIENT FAULT-TOLERANT OPERATIONS WITH SUPERCONDUCTING CIRCUITS," which are each incorporated by reference herein in their entirety.

FEDERALLY SPONSORED RESEARCH

This invention was made with government support under W911NF-14-1-0011 awarded by the United States Army Research Office. The government has certain rights in the invention.

BACKGROUND

Quantum information processing uses quantum mechanical phenomena, such as energy quantization, superposition, and entanglement, to encode and process information in a way not utilized by conventional information processing. For example, it is known that certain computational problems may be solved more efficiently using quantum computation rather than conventional classical computation. However, to become a viable computational option, quantum computation requires the ability to precisely control a large number of quantum bits, known as "qubits," and the interactions between these qubits. In particular, qubits should have long coherence times, be able to be individually manipulated, be able to interact with one or more other qubits to implement multi-qubit gates, be able to be initialized and measured efficiently, and be scalable to large numbers of qubits.

A qubit may be formed from any physical quantum mechanical system with at least two orthogonal states. The two states of the system used to encode information are referred to as the "computational basis." For example, photon polarization, electron spin, and nuclear spin are two-level systems that may encode information and may therefore be used as a qubit for quantum information processing. Different physical implementations of qubits have different advantages and disadvantages. For example, photon polarization benefits from long coherence times and simple single qubit manipulation, but suffers from the inability to create simple multi-qubit gates.

Different types of superconducting qubits using Josephson junctions have been proposed, including "phase qubits," where the computational basis is the quantized energy states of Cooper pairs in a Josephson Junction; "flux qubits," where the computational basis is the direction of circulating current flow in a superconducting loop; and "charge qubits," where the computational basis is the presence or absence of a Cooper pair on a superconducting island. Superconducting qubits are an advantageous choice of qubit because the coupling between two qubits is strong making two-qubit gates relatively simple to implement, and superconducting qubits are scalable because they are mesoscopic components that may be formed using conventional electronic circuitry techniques. Additionally, superconducting qubits exhibit excellent quantum coherence and a strong non-linearity associated with the Josephson effect. All superconducting qubit designs use at least one Josephson junction as a non-linear non-dissipative element.

Scalable quantum computation will ultimately require fault tolerance for every logical circuit component, including state preparation, gates, measurements, and error correction. In a fault-tolerant implementation of a circuit, a first-order error in that circuit leads to a correct output after a round of error correction. Fault-tolerant syndrome measurements are a particularly crucial element because they appear frequently in every encoded circuit.

SUMMARY

According to some aspects, a method is provided for implementing a fault-tolerant quantum operation using a cavity and an ancilla transmon, the method comprising: encoding a logical qubit using more than two energy levels of the cavity; encoding information using more than two energy levels of the ancilla transmon; and creating an interaction between the cavity and the ancilla transmon that decouples at least one error type in the ancilla transmon from the cavity.

In some embodiments, creating the interaction between the cavity and the ancilla comprises applying a sideband drive.

In some embodiments, the evolution of the logical qubit of the cavity is transparent to first-order ancilla errors when the sideband drive is applied.

In some embodiments, the sideband drive is configured to adjust a first frequency shift on the cavity by the ancilla transmon in a first excited state equal to a second frequency shift on the cavity by the ancilla transmon in a second excited state; and adjust a third frequency shift on the cavity by the ancilla transmon in a ground state excited state is equal to a second frequency shift on the cavity by the ancilla transmon in a second excited state.

In some embodiments, the quantum operation comprises a quantum logic gate.

In some embodiments, the quantum logic gate comprises a selective number-dependent arbitrary phase (SNAP) gate.

In some embodiments, the quantum logic gate comprises a controlled-SWAP gate.

In some embodiments, the quantum logic gate comprises an exponential-SWAP gate.

In some embodiments, an error occurs in the transmon, the logical qubit of the cavity is unaffected.

In some embodiments, the quantum operation comprises a quantum measurement.

In some embodiments, the quantum measurement comprises a quantum parity measurement.

In some embodiments, the quantum measurement comprises a measurement of an error syndrome.

According to some aspects, a quantum information system is provided that comprises a cavity configured to support microwave radiation; an ancilla transmon dispersively coupled to the cavity; a microwave source configured to: apply microwave radiation to the cavity to encode a logical qubit using more than two energy levels of the cavity; apply microwave radiation to the ancilla transmon to encode information using more than two energy levels of the ancilla transmon; and apply microwave radiation to create an interaction between the cavity and the ancilla transmon that decouples at least one error type in the ancilla transmon from the cavity.

In some embodiments, applying microwave radiation to create an interaction between the cavity and the ancilla transmon comprises applying a sideband drive.

In some embodiments, the evolution of the logical qubit of the cavity is transparent to first-order ancilla errors when the sideband drive is applied.

In some embodiments, the sideband drive is configured to: adjust a first frequency shift on the cavity by the ancilla transmon in a first excited state equal to a second frequency shift on the cavity by the ancilla transmon in a second excited state; and adjust a third frequency shift on the cavity by the ancilla transmon in a ground state excited state is equal to a second frequency shift on the cavity by the ancilla transmon in a second excited state.

In some embodiments, the quantum operation comprises a quantum logic gate.

In some embodiments, the quantum logic gate comprises a selective number-dependent arbitrary phase (SNAP) gate, a controlled-SWAP gate, or an exponential-SWAP gate.

In some embodiments, when an error occurs in the transmon, the logical qubit of the cavity is unaffected.

In some embodiments, the quantum operation comprises a quantum parity measurement and/or a measurement of an error syndrome.

BRIEF DESCRIPTION OF THE DRAWINGS

Various aspects and embodiments of the disclosed technology will be described with reference to the following figures. It should be appreciated that the figures are not necessarily drawn to scale.

DETAILED DESCRIPTION

Figure 1A:
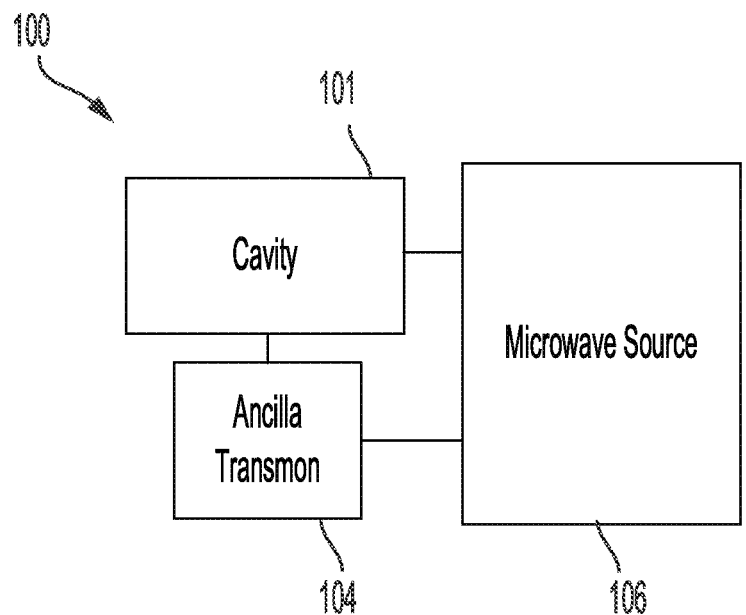
FIG. 1A is a schematic diagram of a quantum information system, according to some embodiments.

The inventors have developed a simplified technique for achieving robust and fault tolerant quantum computing operations with superconducting circuits. Multiple quantum states of superconducting qubits, which are anharmonic oscillators with a ladder of separately addressable energy levels, to prevent the forward propagation of errors, achieve fault-tolerant operations, and improve the performance of syndrome measurements for quantum error correction, readouts of logical states, and even the operation of universal quantum gates can be used. The savings in complexity and hardware arises because one can build special symmetries that prevent error propagation, without introducing additional error mechanisms. This contrasts with conventional schemes, where only two energy levels (qubits not multi-level qudits) are used for both encoding and ancillas, that then require many more components and are harder to realize, test, and operate. The described embodiments extend hardware-efficient realizations of error-correctable logical qubits into a complete scheme for robust quantum operations, preserving the virtues of simplicity reduced part count for a quantum computer.

Fault-tolerance is an important property for any large and robust system. In quantum computing, fault-tolerance means that one can use redundancy and error-correction to build a larger computer, or a longer and more useful algorithm, using parts which still have a finite probability for errors. An important aspect of fault-tolerance is reducing or preventing errors from multiplying such errors should be detected and corrected before they overwhelm the system.

While the general idea of quantum error correction may be well known, an outstanding problem is how to implement an error-corrected computation and how to make it practical. There are several existing schemes (surface code, stabilizer codes, etc.) which can work in principle, but they currently need several orders of complexity in terms of the numbers of qubits, the number of operations on these qubits, and actual performance of the gates themselves. An additional complication is the need for fault-tolerance. Unfortunately, in quantum gates a single-qubit error can propagate to become multiple errors. For instance, a bit-flip in the control qubit that occurs before a C-NOT gate results not only in this original control qubit being corrupted, but now to an additional error in the target qubit. Likewise, a phase error on the target qubit becomes an additional phase error on the control. In both examples, one error has become two. This means that even if we have a quantum error-correction scheme that can prevent an individual error of either type, the scheme is not fault-tolerant and the computation may fail.

One conventional approach to error correction is to use multiple qubits not only to encode the information in a logical qubit, but also to replace every ancilla qubit with multiple physical qubits. Ancilla qubits are important elements in quantum computing and especially in error-correction. For example, when measuring an error syndrome for a logical qubit, conventional approaches detect a correlation between multiple qubits a kind of parity detection. As one example, in the seven-qubit Steane code for quantum error correction, one needs to measure quantities such as four-way correlations of X or Z operators between these seven qubits. To do so, one employs a series of four C-NOT gates, where a single ancilla qubit is used as the control or the target. Then a projective measurement of the ancilla converts his measured value ($Z=+1$ or $Z=-1$) into a projection on this four-qubit correlation either an error has occurred or it has not. Because there are six required correlations (or stabilizers) to measure, one requires for minimal error correction not only the seven qubits of the logical, but six additional ancillae and measurements—a total of 13 qubits and approximately 24 two-qubit gates in the circuit.

Unfortunately, this scheme may not be fault-tolerant. Because each ancilla interacts directly with multiple qubits in the logical register, a single error (an X or Z flip) in the ancilla can result in multiple errors in the logical, the operator cannot in any way work out what has happened, and future use of the logical qubit may be corrupted. One possible solution is to replace each ancilla used for the stabilizer measurements with a group of four (hopefully independent) qubits. This solution requires a more complicated circuit in which the four ancillae are first entangled (and checked themselves for errors), and then each ancilla interacts with only one physical qubit in the logical register. Now an error in any physical ancilla can only lead to one instance of error propagation, inducing only a single error in the logical register which can be caught and remediated in the next round. Finally, more operations on the ancillae are required to decode the information and learn whether there was or was not an original error in the logical register. One downside of this approach is that circuit complexity is dramatically increased now, in addition to the original seven qubits for the register, an additional 24 ancillae and over 60 gates are required for a single error-checking procedure. The increase in number of parts and gates has another negative consequence: it is desirable to have a low probability that more than one error occurs in any of the ancillae or register qubits, or in any of the gates performed. Since this approach results in a longer circuit, with more qubits, to maintain, e.g., a 10% chance of an error (so that making it second-order helps significantly), the threshold for reaching break-even increases (to about one part in 10,000 in this example) and it is harder to be scalable. Thus, not only does this approach to fault-tolerance need more elements, but higher performance in all of those elements, which can be very demanding. Making computations robust and scalable in these ways is an important limitation to building practical and economically viable quantum computers.

The inventors have developed a novel and hardware-efficient approach for realizing logical qubits, relying on the encoding of information in linear oscillators that have multiple energy levels. This approach increases the usable state space without introducing new kinds of errors, which contrasts with conventional error-correction where the necessary state space is built by introducing additional physical qubits (each with only two energy levels), which each come with additional error mechanisms. Thus in the presently described hardware-efficient scheme that uses multiple levels (a d-level "qudit" rather than a two level qubit), fewer states and fewer parts are needed to be able to detect and correct the actual errors. The inventors have developed the ability to use superconducting cavities as such hardware-efficient logical qubits, where photon-number parity serves as an error-detection syndrome for the dominant error mechanism of photon loss.

But even in this hardware-efficient encoding scheme, a nonlinear ancilla (usually a transmon qubit) is required to detect the error-syndrome and measure the photon number parity. This may be done with very high fidelity and a very rapid cadence (i.e. many measurements are made in the time between typical, naturally occurring errors). These are important prerequisites for a functioning logical qubit, and indeed the inventors have shown performance at or just beyond break-even, where the operation of the error-correction system extends the useful lifetime of encoded information longer than any passive scheme with the same hardware. One limitation on the performance, however, is that the error-detection mechanism was not fault-tolerant.

Thus, according to some embodiments, hardware-efficiency can be applied to superconducting qubits or nonlinear systems, as well as linear superconducting cavities. This is quite generally applicable for a variety of tasks in quantum information processing. Application of this technique to multiple functions is demonstrated theoretically and in the laboratory, showing that the techniques can indeed improve performance and achieve improved fault-tolerance. This concept can be applied, as a software upgrade or a modification in the pulse sequences and protocols, in systems used today. In some embodiments, one can build fault-tolerance into operations with no additional hardware required. These are very general principles that can apply to a wide range of quantum hardware, in any technology. In particular for superconducting qubits, virtually all devices today are made so that they have the required additional levels and can incorporate features and concepts of embodiments described herein.

One example of hardware-efficient fault-tolerance is for the photon number parity measurement of a logical qubit encoded in a cavity the "cat code." The measurement of photon loss errors (changing the number parity from say even to odd) is fault-tolerant to several known physical error types. If a photon loss occurs during a measurement, for example, this can lead to an incorrect measurement. However, the photon loss does not lead to additional errors, and can be caught in the next round. When the measurement is repeated, the error will then be detected. There is only a second-order probability, which is small, that two errors will actually occur in the time between successive measurements. The measurement can be made robust and fault-tolerant by repeating and majority voting.

There are three types of errors in the transmon ancilla used to probe the logical qubit and detect errors: dephasing, relaxation, and excitation. Typically the rates of dephasing and relaxation are similar, and excitation is smaller (and in principle should be completely negligible at the operating temperatures used). If the transmon qubit undergoes a dephasing error during the measurement of parity, it leads to an incorrect result, but no additional errors. This is relatively easy to deal with via multiple measurements. If the transmon undergoes a relaxation or excitation during the measurement, it also leads to a small probability of an incorrect measurement. More importantly, however, it imparts a phase error on the encoded cavity which is not a correctable type of error. In other words, the measurement is not fully fault-tolerant to the known errors of the ancilla, and there is forward propagation of errors. This effect was a significant limitation to the performance of the error-correction protocol.

Because the specific form of the error in the transmon ancilla is known, it points to a novel but simple solution. The lack of fault-tolerance to the transmon ancilla arises in this particular case because the transmon imparts a (necessary) state-dependent frequency shift on the photons encoding the information in the cavity. The inventors have recognized and appreciated that this can be avoided by employing at least one additional energy level in the transmon. The first ingredient to achieve this result is that the ancilla transmon has multiple levels (e.g., is a qudit), the ground state |g>, the excited state |e>, and at least a second excited state |f>, and the transitions between any of these levels can be controlled with microwave pulses. The second ingredient is that relaxation occurs only "one rung at a time," that is |e> relaxes to |g>, but |f> relaxes only to |e>. If the frequency shift for two excited states (|f> and |e>) on the cavity is identical, then a relaxation from |f> to |e> does not induce a forward error propagation, or an unknown phase on the cavity. But if the frequency shifts of |f> and |e> are different from |g>, then we may still learn the photon number parity can still be learned and the syndrome measurement carried out. This technique makes the ancilla usage fault-tolerant with respect to transmon relaxation.

A similar effect happens during idling times due to excitation. If the ancilla is in |g>, no relaxation can occur. If, however, an excitation from |g> to |e> occurs, and the frequency shift of |g> and |e> are different, then this also induces an unwanted forward propagation of error. If, instead, the frequency shifts of |g> and |e> are matched during idling phases, forward propagation of errors due to excitation is prevented. It is in principle possible to extend these schemes with multiple levels (and matching the coupling to the logical qubit) to protect against both relaxation and excitation, or indeed to employ an additional level to compensate for each additional error mechanism in the ancilla for which fault-tolerance is desired.

The frequency shift on the cavity by the transmon (or vice-versa, the frequency shift per photon in the cavity on the transmon) is conventionally called chi ($\chi$). In the transmon, the natural chi depends on the energy level (|g>, |e>, or |f>), because the transmon is anharmonic. As a specific example of a fault-tolerant ancilla, the inventors have proposed and demonstrated a mechanism to match the frequency shifts (or chi values) for the pairs of states |g> and |e> (to make idling operations fault-tolerant) or |e> and |f> (for making syndrome measurements fault-tolerant). To achieve this, RF-dressing of the levels is used, but could be arranged in a variety of other means by using other superconducting qubit types or circuits with more Josephson junctions. Generalizations of this technique could also be used for a weakly anharmonic cavity as the ancilla, or for other dispersive or non-dispersive interactions between a qubit and register. Another possibility is to use a different interaction, e.g. a three-wave mixing between cavity and a Josephson device (such as the Superconducting Non-linear Asymmetric Inductive eLement (SNAIL)), where RF driving turns ON the dispersive interaction and this is controlled to achieve the required symmetries or equalities of phase shifts with each ancilla level.

Some embodiments can provide over an order of magnitude protection against excitation of an ancilla transmon for a cavity, improving the phase errors to make them negligible compared to energy relaxation. Similar improvements in the ability to repeatedly measure (using three levels) photon parity with a transmon are also possible. Furthermore, this concept can be applied to correction of single-qubit gates on a bosonic qubit, on cavity-cavity gates that are mediated by a transmon and on measurements of the information in a logical qubit.

Some embodiments provide a simpler and more practical path for implementing robust and fault-tolerant quantum operations. Beyond specific implementations for superconducting circuits, the idea is quite general and can be useful in other quantum technologies where there are multiple levels available and a control over the form on the interaction Hamiltonian. The inventors demonstrate how these techniques can improve the fidelity and fault-tolerance of several operations in specific implementations, which requires just a change in the experimental protocols, but no additional hardware. Because the circuit length or system complexity of a fault-tolerant implementation of an operation is not significantly increased in this approach, lower thresholds which are quicker and easier to satisfy in order to show robust operations and error-corrected systems can be provided. This can be of major significance in reducing the cost and time for realizing useful quantum information processing systems.

Thus, some embodiments are hardware-efficient, as only a single multilevel ancilla transmon is used, rather than multiple ancillae. Some embodiments make the cavity evolution transparent to first-order ancilla errors by engineering the cavity-ancilla interaction in situ with an off-resonant sideband drive. Some implementations result in a sevenfold increase in the number of syndrome measurements performed without destroying the logical qubit, while maintaining a similar syndrome assignment fidelity. These results demonstrate that hardware-efficient approaches which exploit system-specific error models can yield practical advances towards fault-tolerant quantum computation.

Some embodiments, implement an error-transparent syndrome measurement. Two approaches are used to achieve this: (1) using many-level systems for encoding both the logical qubit and the ancilla qubit, and (2) engineering an interaction that decouples dominant ancilla errors from the logical qubit, while leaving the desired measurement interaction undisturbed. The degree of fault tolerance is determined by comparing the performance of the parity measurement using the fault-tolerant protocol to the traditional parity measurement using a two-level ancilla. The fault-tolerance gain is defined as the ratio of the error propagation probabilities between these two implementations. Some embodiments achieve a fault-tolerance gain of seven, bringing the loss of logical qubit fidelity down to 1.8%±0.2% per syndrome measurement. The syndrome assignment fidelity of 83% is largely unaffected by moving to the fault-tolerant protocol.

FIG. 1 is a schematic diagram of a quantum information system 100, according to some embodiments. The quantum information system 100 includes a cavity 101, an ancilla transmon 104, and a microwave source 106. While only one cavities and one ancilla transmon are shown in the example system 100 of FIG. 1, other embodiment may include additional cavities and transmons.

The cavity 101 may be any type of cavity that supports quantum states of microwave radiation. For example, in some embodiments, the cavity 101 may be a transmission line resonator or a three-dimensional cavity formed from a superconducting material, such as The ancilla transmon 104 is dispersively coupled to the cavity 101. The ancilla transmon 104 can be controlled to implement rotations of the quantum state of the ancilla transmon 104 itself. Additionally, the ancilla transmon 104 can be controlled to interact with the associated cavities 101, respectively, to implement controlled interactions between the ancilla transmon 104 and the cavity 101.

The microwave source 106 may be coupled to the cavity 101 and the ancilla transmon 104. The coupling between the microwave source 106 and the other components provides a way for the microwave source to apply microwave radiation to each of the components of the multi-cavity quantum information system 100. In some embodiments, the microwave source 106 may be capacitively coupled to each of the components.

Figure 1B:
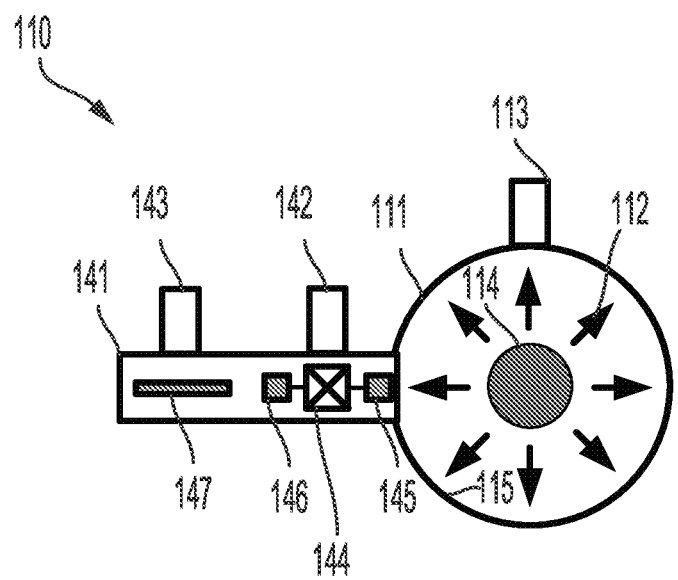
FIG. 1B is a schematic diagram of example an cavity and transmon of the quantum information system of FIG. 1A, according to some embodiments.

FIG. 1B is a schematic diagram of a particular example system 110 that may play the role of the quantum information system 100 of FIG. 1A (for simplicity the microwave source 106 is not shown), according to some embodiments. The system 110 includes a three-dimensional (3D) cavity 111 and an ancilla device 141.

The 3D cavity 111 and 112 acts as a 3D version of a $\lambda/4$ transmission line resonator between a central stubs 114 and outer wall 115. For example, the diameter of central stub 114 may be 3.2 mm and the diameter of the outer wall 115 may be 9.5 mm. It is noted, however, that embodiments are not limited to any particular dimensions. The resonant frequency of the cavity 101 may be determined by the height of the central stub 114 within the cavity 111. For example the central stub 114 may have a height of 4.8 mm. The 3D cavity 111 supports microwave radiation 112 of a first frequency. In some embodiments, the cavity 111 includes port 113 through which microwave radiation from the microwave source 106 may be applied. Applying microwave radiation to a cavity may, for example, implement a displacement operation on the quantum state of the cavity.

Ancilla device 141 couples to a the cavity 111. The ancilla device 141 includes a pump port 142 for driving a transmon 144 with pump and readout pulses of microwave radiation and a readout port 143 for receiving readout microwave signals from the transmon 144. The transmon 144 is coupled to the first cavity 111 via a first antenna pad 145 that at least partially protrudes into the first cavity 111. A second antenna pad 146 couples the transmon 144 to a quasi-planar resonator 147.

The ancilla devices 141 may be used to implement a controlled-phase-shift (CPS) operation, which is represented as:

$$CPS = |g\rangle\langle g| \otimes I + |e\rangle\langle e| \otimes e^{i\theta \hat{n}}, \quad (1)$$

where $\hat{n} = a^\dagger a$ is the number operator of the bosonic mode of the particular cavity coupled with the transmon. In some embodiments, the phase shift is $\pi$ and resulting in the implementation of a controlled-Parity operation since the photon number parity operation is $\hat{P} = (-1)^{a^\dagger a}$. In some embodiments, the CPS gate can be obtained from the time evolution under the Hamiltonian with dispersive coupling between the ancilla transmon and the respective cavity $$H_{dis} = h\chi |e\rangle\langle e| \otimes \hat{n} \quad (2)$$

for a time duration $t = \pi/\chi$ and coupling strength $\chi$.

Some embodiments implement an error-transparent syndrome measurement on a logical qubit encoded in the single 3D superconducting cavity 111. As an example, the cavity may have the properties $\omega_c/2\pi = 4.5$ GHz, $T_1^c = 1.1$ ms. In some embodiments quantum information is encoded using Schrödinger cat states with even photon number parity, and mean photon number two. In such an encoding, the dominant cavity error, single-photon loss, causes the parity to change from even to odd, without destroying the encoded information. The information can be recovered if the number of parity jumps is faithfully measured, requiring parity measurements to be performed frequently relative to the single photon loss rate. The ancilla transmon 144 is ($\omega_q/2\pi = 6.5$ GHz, $T_1^q = 26$ μs, $T_2^q = 12$ μs) is dispersively coupled to the cavity 111 and used to measure the parity of the system.

The dispersive interaction Hamiltonian of the quantum information system 110 can be represented as $$\hat{H}_{int}^0 = \chi_e^0 \hat{a}^\dagger \hat{a} |e\rangle\langle e| \chi_f^0 \hat{a}^\dagger \hat{a} |f\rangle\langle f| \quad (3)$$

where $\chi_e^0/2\pi = 93$ kHz and $\chi_f^0/2\pi = 236$ kHz are the bare cavity frequency shifts for the respective ancilla states ($\chi_g^0 = 0$ in this frame of reference), and $\hat{a}$ is the cavity annihilation operator. Evolution under this interaction for a time $\pi/\chi_e^0 \sim 5.4$ μs maps the parity of the cavity onto the phase of a $|g\rangle/|e\rangle\langle$ superposition in the ancilla. Performing Ramsey interferometry on the ancilla to determine this phase yields an effective QND measurement of the parity. This parity measurement technique was used to demonstrate error correction at the break-even point, at which the error-corrected lifetime equals that of the best element of the system.

One limitation of error-correction based on the scheme described above is logical errors induced by relaxation of the ancilla during the parity mapping. This can be seen by considering a jump from the ancilla excited state to the ground state during the $\pi/\chi_e^0$ interaction time. dA is a quantum circuit diagram 200 showing the effect of this ancilla energy relaxation for a conventional non-fault tolerant scheme. The cavity is prepared in a Schrödinger cat state (depicted schematically by its Wigner tomogram 201) and the ancilla is prepared in a superposition of the ground state $|g\rangle\langle$ and the excited state $|e\rangle\langle$. The lines 202 represent the individual states of the cavity. $C_\theta$ represents a cavity CPS interaction of angle $\theta$ conditional on the state of the ancilla. A first cavity CPS interaction 203 with $\theta = \chi t$ is performed followed by a second cavity CPS interaction 205 with $\theta = \pi - \chi t$. An error 207 occurs at time $t \in (0, \pi/\chi)$ results in a cavity phase shift of $\chi t$. As shown, this is equivalent to a CPS interaction 211 of $\theta = \pi$ followed by a CPS interaction 213 of $\theta = \chi t - \pi$ with the error 214 occurring in between. While such a jump error prevents one from correctly determining the photon number parity, it also has the more harmful effect of completely dephasing the cavity. Since the jump time is nearly uniformly distributed between 0 and $\pi/\chi_e^0$, the cavity acquires a phase space rotation uniformly distributed between 0 and $\pi$. This completely dephases the cavity state when averaged over t, as illustrated by the Wigner tomogram 215, showing a dephased the Schrödinger cat state.

Thus, an uncorrectable logical bit-flip error is imposed with a probability proportional to the number of parity measurements performed. This cost forces the designer of an error correction protocol to measure the error syndrome less frequently than would otherwise be desirable, and consequently reduces the potential achievable lifetime gain. At a higher level, the non-fault-tolerance of the conventional protocol arises because relaxation errors do not commute with the interaction Hamiltonian. In particular, the commutator of the interaction Hamiltonian with the dominant error is $[\hat{H}_{int}^0, |g\rangle\langle e|] = \chi_{eg}^0 a^\dagger a|g\rangle\langle e|$ where $\chi_{eg}^0 \equiv \chi_e^0 - \chi_g^0$, which generates a nontrivial operation on the logical subspace, and is therefore an uncorrectable error. In contrast, pure dephasing of the ancilla, which occurs at a comparable rate, does not result in unwanted cavity decoherence because the error ($|e\rangle\langle e|$) commutes with the interaction. Therefore, the end result of an ancilla dephasing event during the interaction is equivalent to an ancilla dephasing event after the interaction, which clearly does not affect the logical qubit. The parity measurement is therefore "transparent" with respect to ancilla dephasing.

In some embodiments, error-transparency may be extended to include relaxation by introducing a third level to the ancilla Hilbert space. This provides an additional degree of freedom, allowing the cavity-ancilla interaction rate to be maintained, while zeroing the rate of first-order error propagation. The initial ancilla encoding is changed to a superposition of $|g\rangle$ and $|f\rangle\langle$ (instead of $|g\rangle\langle$ and $|e\rangle\langle$), the dominant error becomes relaxation from $|f\rangle\langle$ to $|e\rangle\langle$ (selection rules forbid direct $|f\rangle\langle$ to $|g\rangle\langle$ transitions). The commutator of this error ($|e\rangle\langle f|$) with the interaction Hamiltonian is $\chi_{fe}|e\rangle\langle f|\hat{a}^\dagger\hat{a}$. Because the measurement rate (which scales with $\chi_{fg}$) is independent of the dephasing rate (which scales with $\chi_{fe}$), it becomes feasible to maintain the measurement while removing relaxation-induced dephasing by choosing $\chi_{fg}$ large, and $\chi_{fe}=0$. The desired fault-tolerant interaction Hamiltonian is therefore $$\hat{H}_{int}^{FT} = \chi_d a^\dagger a(|e\rangle\langle e| + |f\rangle\langle f|), \quad (2)$$

which clearly commutes with ancilla relaxation from $|f\rangle\langle$ as well as dephasing events.

Figure 2A:
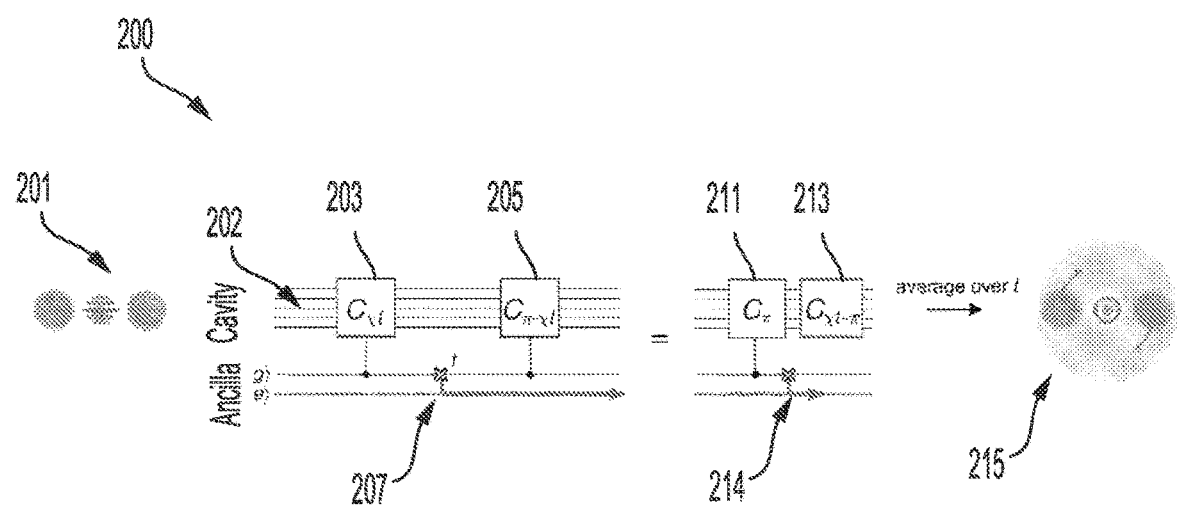
FIG. 2A is a quantum circuit diagram showing the effects of an error in a non-fault tolerant protocol.
Figure 2B:
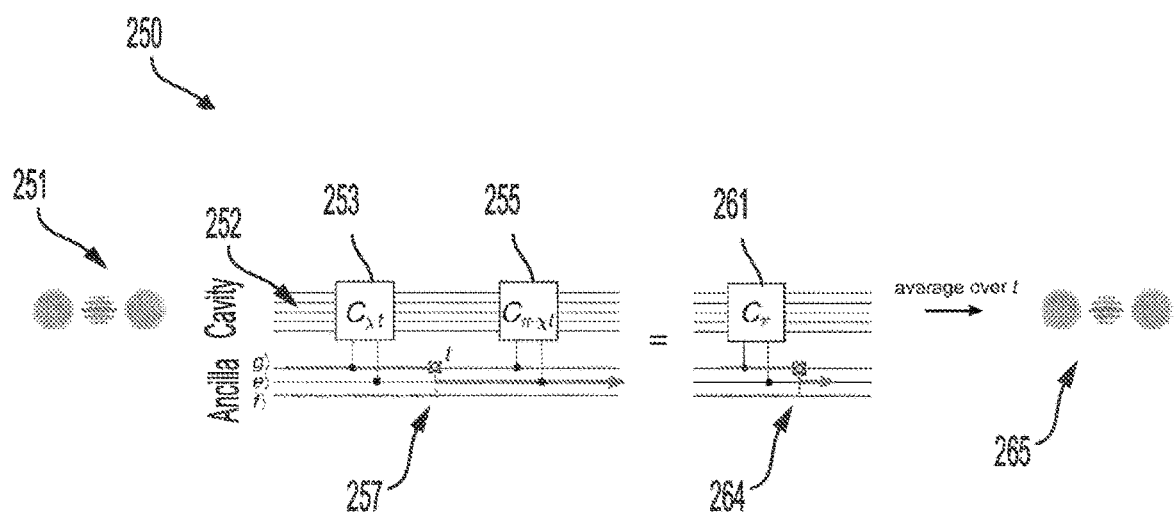
FIG. 2B is a quantum circuit diagram showing the effects of an error in a fault tolerant protocol.

FIG. 2B is a quantum circuit diagram 200 showing the effect of this ancilla energy relaxation for a fault tolerant scheme, according to some embodiments. The cavity is prepared in a Schrödinger cat state (depicted schematically by its Wigner tomogram 251). The lines 252 represent the individual states of the cavity. $C_\theta$ represents a cavity CPS interaction of angle $\theta$ conditional on the state of the ancilla. A first cavity CPS interaction 253 with $\theta = \chi t$ is performed followed by a second cavity CPS interaction 205 with $\theta = \pi - \chi t$. An error 257 occurs at time $t \in (0, \pi/\chi)$. There is no resulting cavity phase shift. As shown, this is equivalent to a CPS interaction 221 of $\theta = \pi$ followed by the error occurring at the end of the parity map. This is because the error commutes with the interaction. Thus, there is no dephasing of the cavity state as illustrated by the Wigner tomogram 265, showing a the Schrödinger cat state with no dephasing.

Figure 3A:
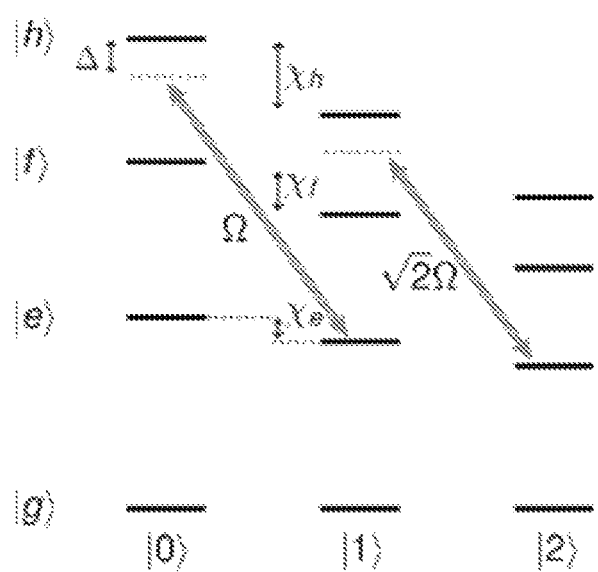
FIG. 3A is a cavity-ancilla energy level diagram, according to some embodiments.
Figure 3B:
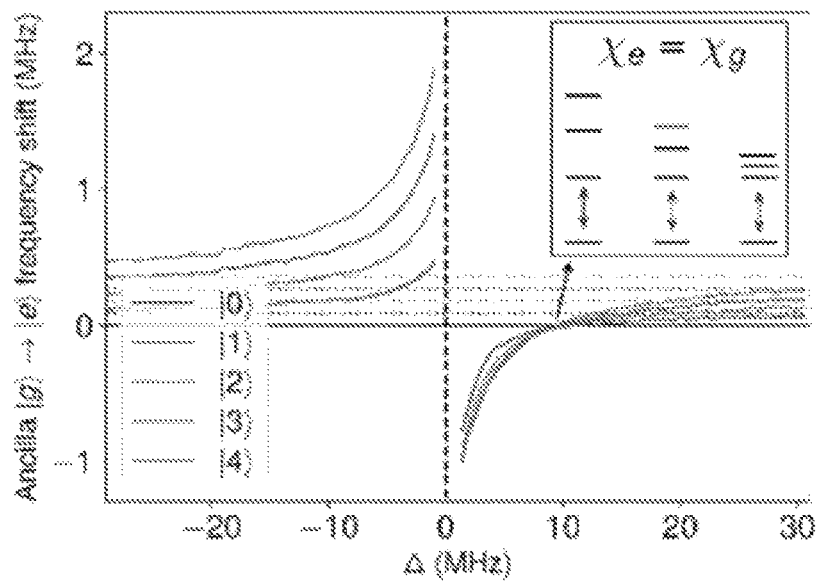
FIG. 3B is a plot of the frequency shift as a function of sideband drive detuning, according to some embodiments.
Figure 3C:
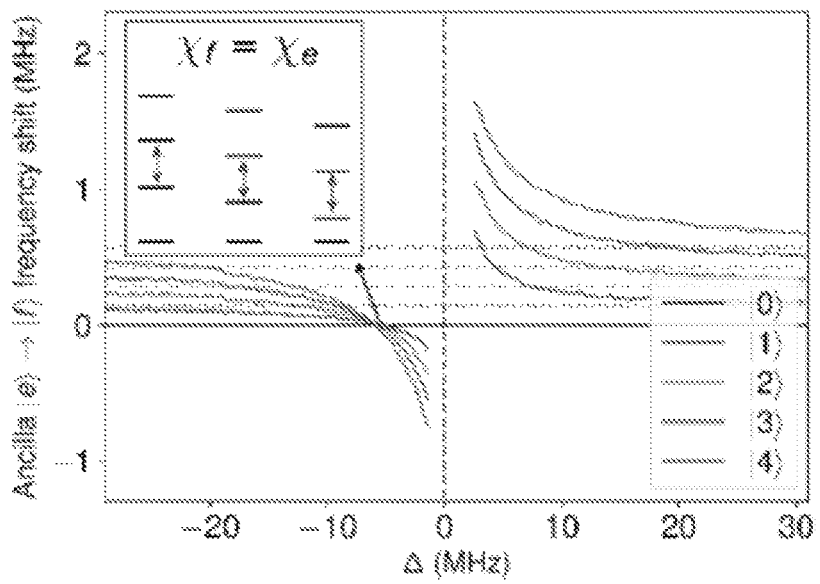
FIG. 3C is a plot of the frequency shift as a function of sideband drive detuning, according to some embodiments.

In some embodiments, a robust method of tuning these two Hamiltonian parameters independently is used. This can be achieved by introducing a sideband tone near the resonant frequency $\omega_{res} = \omega_{he} - \omega_c = 2\pi \times 8$ GHz resulting in the drive term $$\hat{H}_d = \frac{\Omega}{2}\hat{a}^\dagger |e\rangle\langle h|e^{i\Delta t} + h.c., \quad (3)$$

which couples the levels $|e,n\rangle\langle$ and $|h,n-1\rangle$, with n the number of cavity photons, and $|h\rangle$ the third excited ancilla state. FIG. 3A illustrates the resulting cavity-ancilla energy level diagram for the multiple transmon states ($|g\rangle\langle$, $|e\rangle\langle$, $|f\rangle\langle$, $|h\rangle\langle$) and the photon number states ($|0\rangle\langle$, $|1\rangle\langle$, $|2\rangle\langle$) of the cavity. An applied microwave tone (double arrows) drives the $|e n\rangle$, $|h,n-1\rangle\langle$ transition frequency with Rabi rate $\Omega$ and detuning $\Delta$. The resulting Stark shift changes the effective $\lambda_e$ ($\chi_h$) by an amount $\Omega^2/4\Delta$. For the drive amplitude used throughout this particular experiment, the Rabi oscillation rate is $\Omega/2\pi=1.7$ MHz when the detuning from resonance $\Delta=0$. When sufficiently detuned ($\Delta \ll \Omega$) this time-dependent Hamiltonian can be approximated with the time-independent effective interaction:

$$\hat{H}_{eff} = \frac{\Omega^2}{4\Delta}[\hat{a}^\dagger|e\rangle\langle h|, \hat{a}|h\rangle\langle e|] = \chi_e^{ind}\hat{a}^\dagger\hat{a}(|e\rangle\langle e| - |h\rangle\langle h| - \delta_0|h\rangle\langle h| \quad (4)$$

to first order, where $\chi_e^{ind} = \delta_0 = \Omega^2/4\Delta$. This Hamiltonian has the desired form of a dispersive interaction Hamiltonian, conditioned on the ancilla being in $|e\rangle$ or $|h\rangle$. By choosing the detuning, one can engineer an induced $\chi_e^{ind}$ with either positive or negative sign. Therefore, when considering the total interaction Hamiltonian $\hat{H}_{int} = \hat{H}_{int}^0 + \hat{H}_{eff}$, this allows for the total cancellation of either $\chi_{eg}^0$ (at $\Delta/2\pi=8.28$ MHz, as shown in FIG. 3B) or $\chi_{fe}^0$ (at $\Delta/2\pi=-6.4$ MHz, as shown in FIG. 3C). The linear component of the dispersive interaction can be completely cancelled, leaving only the higher order nonlinear dispersive shift of order $\Omega^4/\Delta^3 \approx 2\pi \times 15$ kHz. FIG. 3B and FIG. 3C illustrate the cancelling of the dispersive interaction using the sideband drive. FIG. 3B and FIG. 3C show the result of spectroscopy of the $|g\rangle\langle$ to $|e\rangle\langle$ and $|e\rangle\langle$ to $|f\rangle\langle$ transition respectively, with a varying number of photons in the cavity. $\chi_{eg}$ and $\chi_{fe}$ as well as higher order nonlinear dispersive shifts can be extracted from spread in transition frequencies with respect to photon number. The indicated crossing points show where $\chi_{eg}$ and $\chi_{fe}$ is approximately zero, as emphasized by the arrows in the insets depicting the effective driven level diagram. The dotted lines refer to the transition frequencies when no sideband drive is applied.

Figure 4:
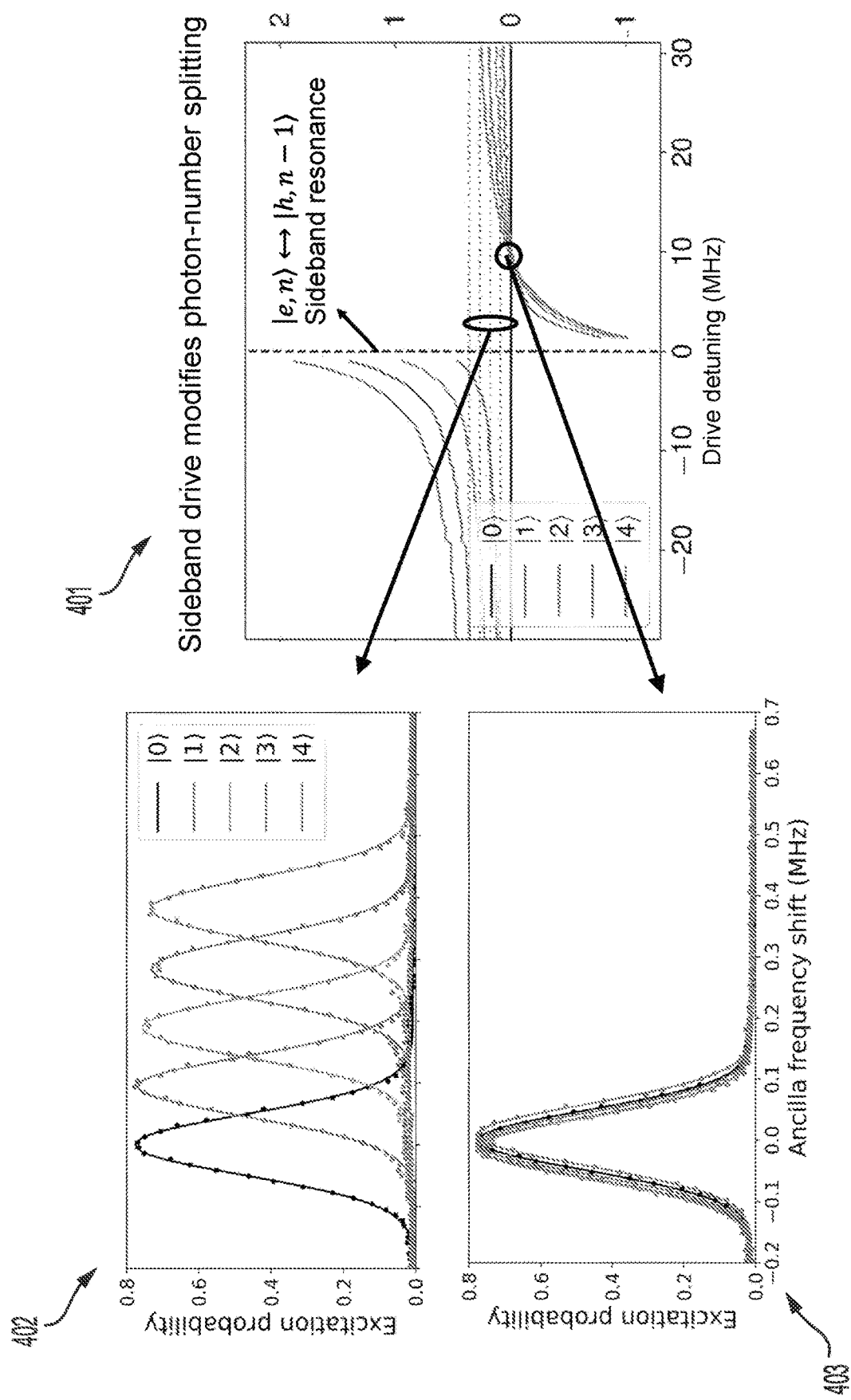
FIG. 4 is a plot of the frequency shift as a function of sideband drive detuning, according to some embodiments.

FIG. 4 further illustrates how the sideband drive modifies the photon number splitting. Plot 401 illustrates the frequency shift as a function of the detuning of the sideband drive. The dotted lines represent the transition frequencies when no sideband drive is applied. Plot 402 shows the excitation probability as a function of ancilla frequency shift for various cavity photon number when the sideband drive is not applied. Plot 403 shows the excitation probability as a function of ancilla frequency shift for various cavity photon number when the sideband drive is applied at the location where the frequency shift is approximately zero for all photon number values.

In some embodiments, sideband drive can be used to decouple the cavity from ancilla transitions between $|g\rangle\langle$ and $|e\rangle\langle$. This can be achieved by choosing a detuning such that $\chi_e^{ind} = -\chi_{eg}^0$. This choice of detuning prevents the cavity from dephasing due to thermal ancilla excitations (which occur on average once every 0.65 ms), resulting in a significant increase in the coherence time of a cavity-encoded qubit. If we prepare an initial state $(|0\rangle\langle + |1\rangle\langle)/\sqrt{2}$ and turn on the detuned sideband drive, the coherence is maintained for ~1.8 ms, close to the limit of $2T_1^c \sim 2.2$ ms. The residual dephasing time of 13±1 ms can mostly be explained by second-order excitations from $|e\rangle\langle$ to $|f\rangle\langle$. This demonstration not only showcases the effectiveness of the drive in cancelling the system-ancilla interaction, but also shows that the addition of the drive does not produce unwanted cavity decoherence at an appreciable level.

Figure 5:
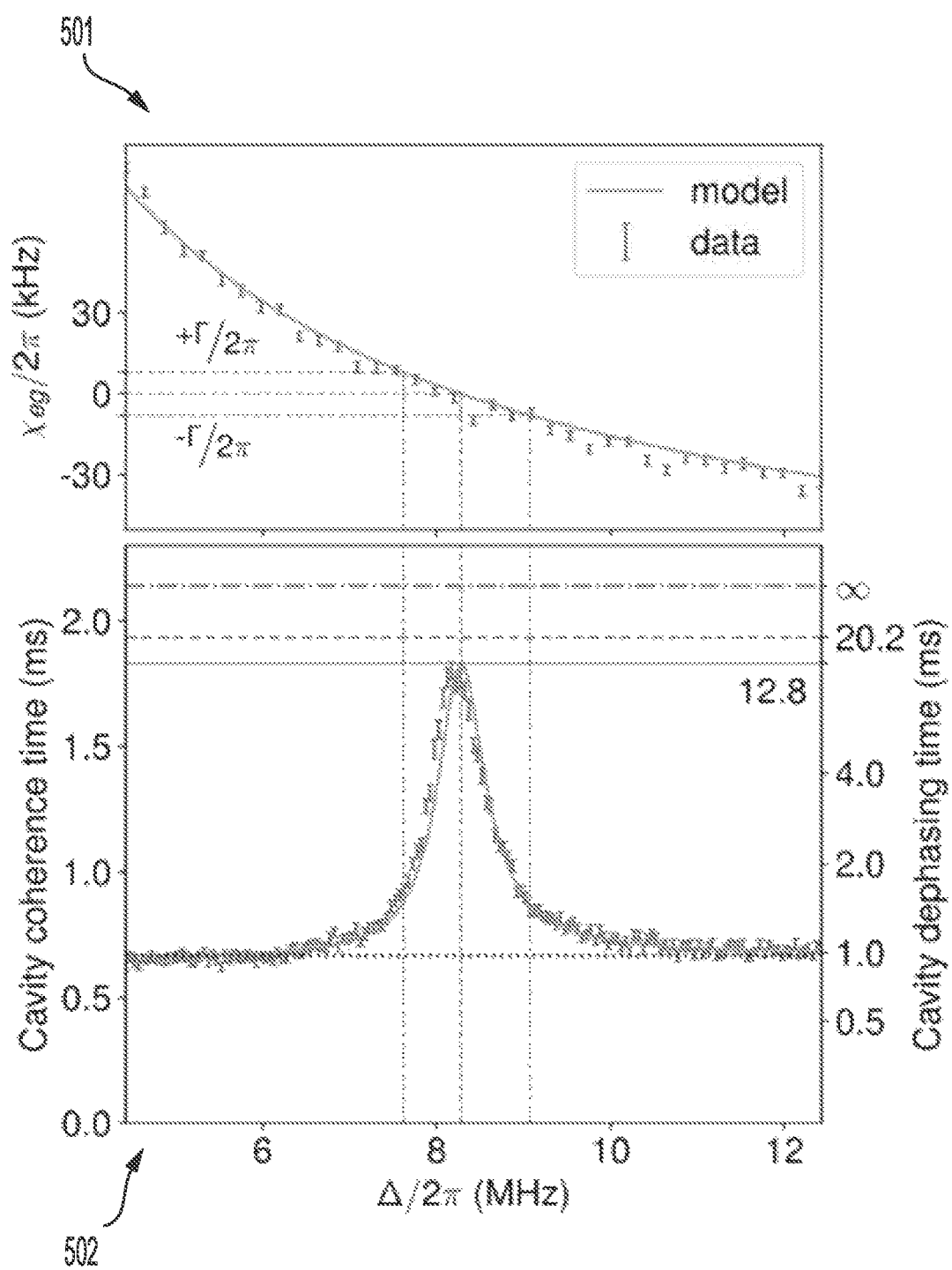
FIG. 5 is a plot of the dispersive interaction between the ground an excited state and the coherence time as a function of sideband drive detuning, according to some embodiments.

While a bare cavity is nearly completely limited by single photon loss, a cavity dispersively coupled to an ancilla experiences dephasing as a result of spontaneous ancilla excitation. FIG. 5 includes a plot 501 showing measured dispersive interaction between $|g\rangle\langle$ and $|e\rangle\langle$ (data point markers) varies as a function of sideband drive detuning from resonance $\Delta$ as $\chi_{eg} = \chi_{eg}^0 + \Omega^2/4\Delta$ (solid line). Plot 502 of FIG. 5 shows the cavity coherence times as a function of the sideband drive frequency obtained from cavity Ramsey experiments. In the absence of quantum error correction, the cavity coherence time is ultimately limited to $2T_1 \sim 2.2$ ms (dot-dashed line near the top). Without sideband drive, thermal ancilla excitations limit the cavity coherence to about 650 μs (dotted line). This dephasing source is almost entirely removed for $\chi_{eg}=0$. The remaining dephasing time (i.e. excluding photon decay) is 13±1 ms (solid grey line), close to the 20 ms limit set by second order thermal excitation from $|g\rangle\langle$ and $|f\rangle\langle$ (dashed line below the dot-dashed line near the top). The analytical behavior of the cavity coherence (solid line that goes through the data points) closely matches the observed values (data points). Protection against thermal ancilla excitations starts occurring when $|\chi_{eg}| < \Gamma/2\pi$ (dashed grey lines), at which point the cavity only partially dephases for the average thermal excitation trajectory.

Figure 6A:
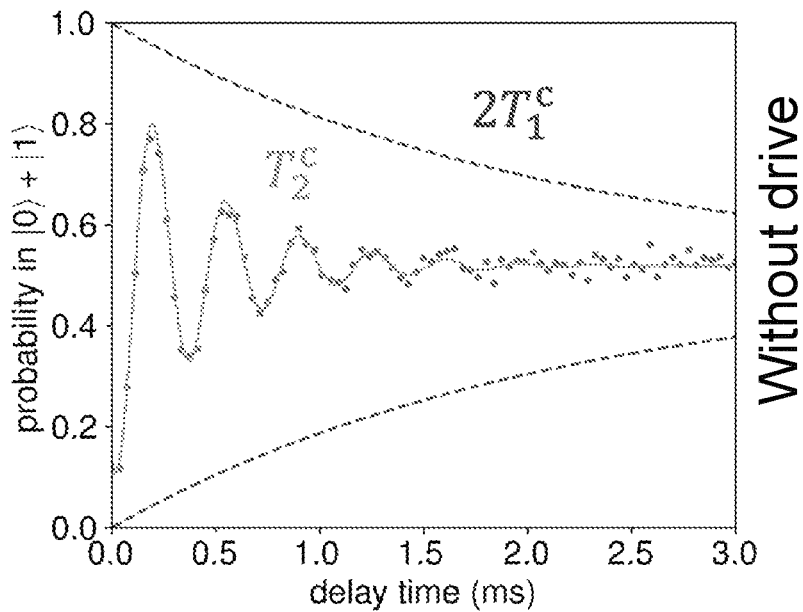
FIG. 6A is a plot of the dephasing times for a system without a sideband drive.
Figure 6B:
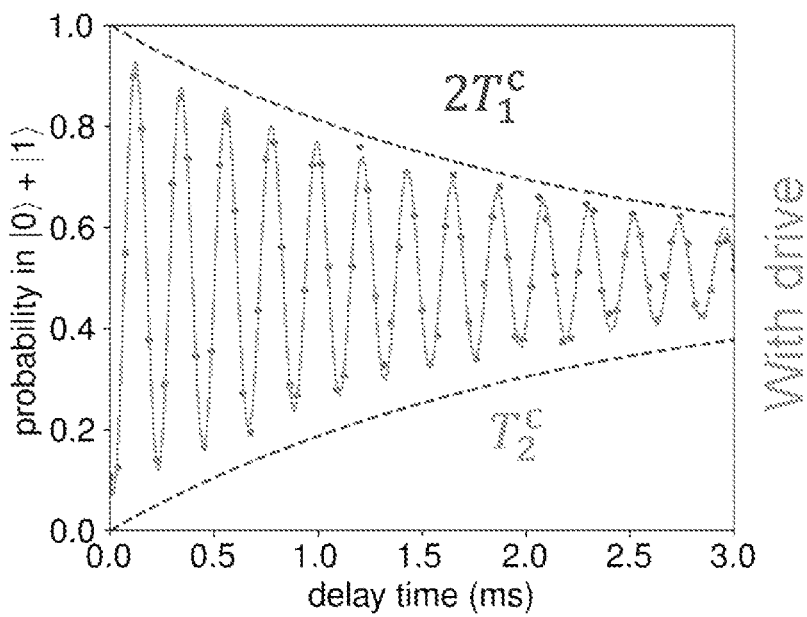
FIG. 6B is a plot of the dephasing times for a system with a sideband drive, according to some embodiments.

FIG. 6A illustrates dephasing time without the sideband drive and FIG. 6B illustrates dephasing times with the sideband drive. As can be seen from comparing the two the dephasing time $T_2^c$ is significantly increased due to the sideband tuning. Moreover, since $(1/T_2^c = \frac{1}{2}T_1^c + 1/T_\phi^c$, the dephasing time is extended to approximately 14 ms.

Figure 7A:
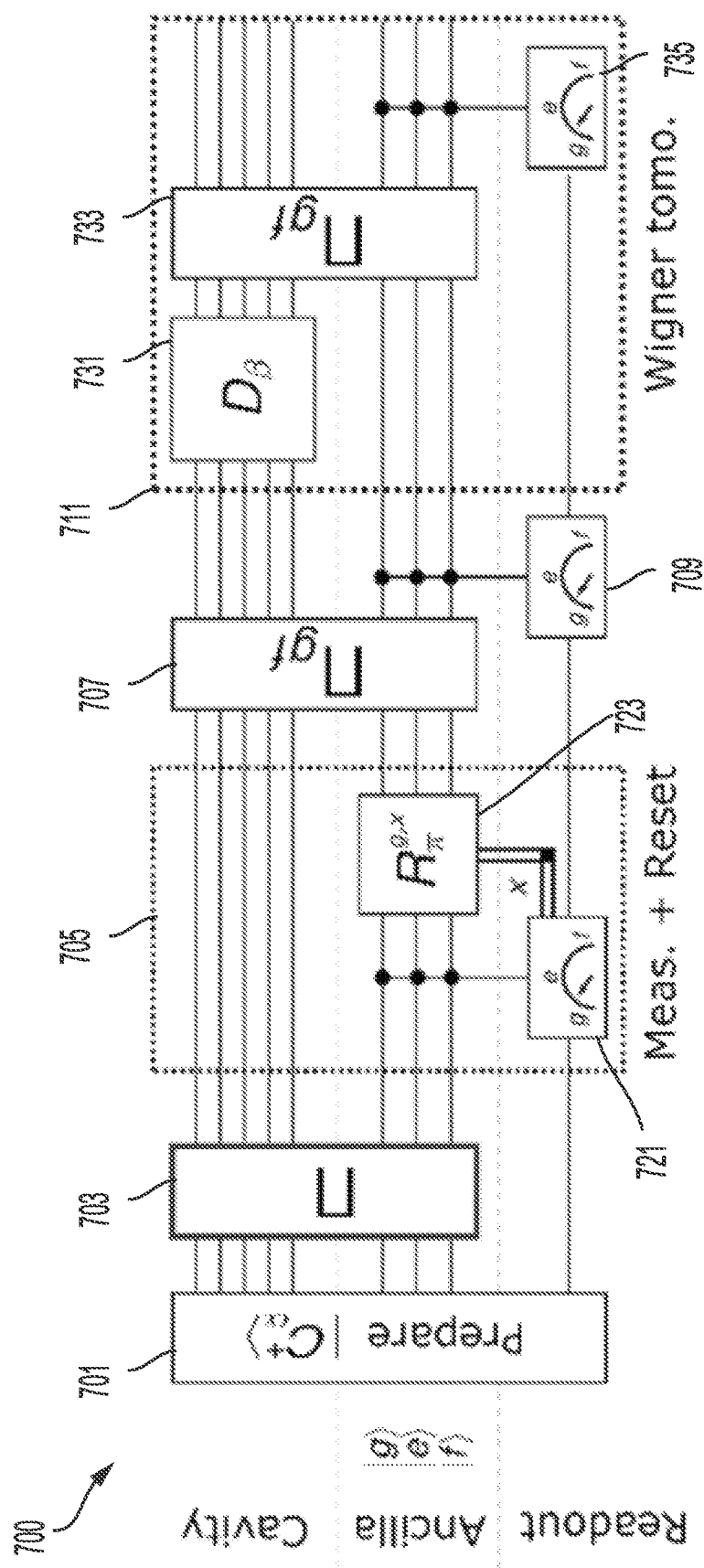
FIG. 7A is a quantum circuit diagram illustrating a fault-tolerant parity measurement protocol, according to some embodiments.

In some embodiments, the detuning $\Delta$ can be selected such that $\chi_e^{ind} = +\chi_{fe}^0$ and the Hamiltonian of Eq. 2, for which ancilla relaxation from $|f\rangle\langle$ to $|e\rangle\langle$ does not change the evolution of the cavity. With this interaction, the fault-tolerant parity measurement protocol may be constructed and compared with non-fault-tolerant implementations. FIG. 7A is a quantum circuit diagram 700 illustrating the protocol according to some embodiments. An even Schrödinger cat state with mean photon number two is prepared 701 in the cavity. The photon-number parity is mapped 703 onto the ancilla in three different ways as outlined below. A measurement and reset 705 is performed by measuring 721 the ancilla to determine the outcome of the parity measurement, and reset it to the ground state using rotation 723. In order to focus on ancilla-induced errors, photon loss is filtered out by performing a second parity measurement 707 (using the $\Pi_{sf}$ protocol, protocol, described below), which is postselected on yielding $|g\rangle$). Finally, Wigner tomography 711 is performed on the cavity in order to determine the fidelity of the final cavity state conditioned on the outcome of the first parity measurement. The Wigner tomography 711 includes a displacement operation 731, a parity measurement 733 and a measurement of the ancilla 735.

The advantages of the fault-tolerant protocol ($\Pi_{FT}$) is demonstrated by comparing it with two alternative protocols: the traditional parity measurement ($\Pi_{ge}$), which uses a $|g\rangle\langle + |e\rangle\langle$ encoding in the ancilla, and $\Pi_{gf}$, which uses a $|g\rangle\langle + |f\rangle\langle$ encoding, but without applying the sideband drive which zeroes $\chi_{fe}$.

Figure 7B:
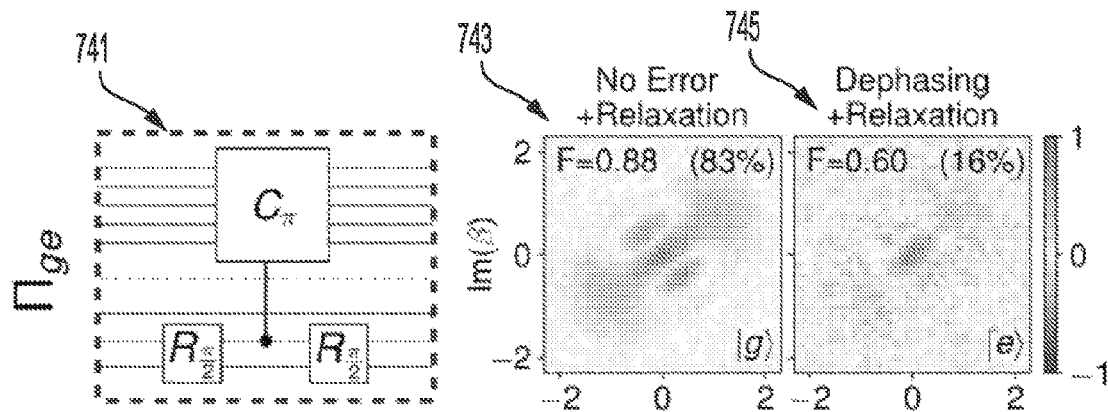
FIG. 7B illustrates a traditional parity mapping protocol and resulting Wigner tomograms.

FIG. 7B illustrates the traditional $\Pi_{ge}$ parity mapping protocol 741, where the outcome is either $|g\rangle\langle$ or $|e\rangle\langle$. The plot 743 shows the resulting Wigner tomogram for the state with the ancilla is measure in the state $|g\rangle\langle$. The plot 745 shows the resulting Wigner tomogram for the state with the ancilla is measure in the state $|e\rangle\langle$. No-error events result in $|g\rangle\langle$, whereas dephasing events lead the ancilla to end up in $|e\rangle\langle$. Relaxation errors cannot be singled out, as they result in a detection of $|g\rangle\langle$ or $|e\rangle\langle$ with equal probability. Relaxation errors therefore manifest as a lowered fidelity of the cavity state for both outcomes.

Figure 7C:
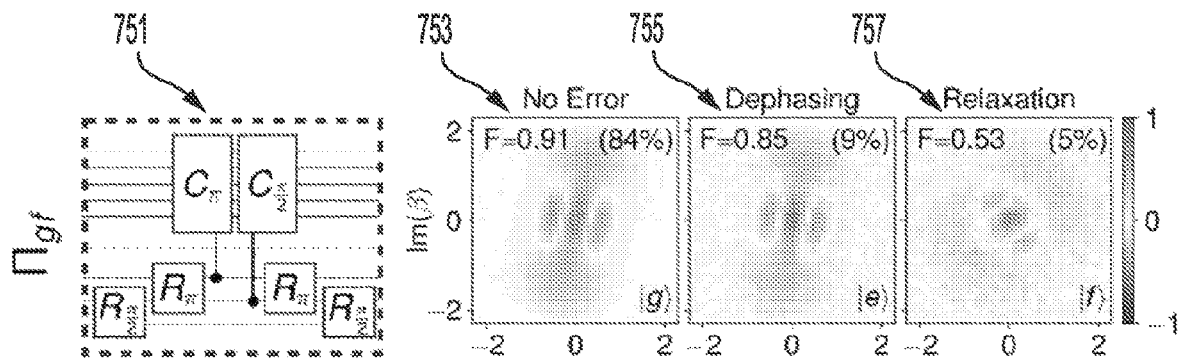
FIG. 7C illustrates a multi-level parity mapping protocol and resulting Wigner tomograms, according to some embodiments.

FIG. 7C illustrates the $\Pi_{gf}$ protocol 751, without applying the sideband drive. To initialize the ancilla in a $|g\rangle\langle + |f\rangle\langle$ superposition, g-e π/2-pulse is used followed by a e-f π-pulse. The system to evolve under the interaction Hamiltonian for a time $\pi/\chi_{fg} \sim 2$ μs so that the cavity phase space acquires a conditional π rotation. After applying the reverse of the ancilla preparation sequence, the ancilla is in state $|g\rangle\langle$ if no ancilla error has occurred. If a dephasing error occurs, the ancilla ends up in $|e\rangle\langle$. In contrast to the $\theta_{ge}$ protocol, relaxation events can be distinguished because for such events, the ancilla ends up in $|f\rangle\langle$. The plot 753 shows the resulting Wigner tomogram for the state with the ancilla is measure in the state $|g\rangle\langle$. The plot 755 shows the resulting Wigner tomogram for the state with the ancilla is measure in the state $|e\rangle\langle$. The plot 757 shows the resulting Wigner tomogram for the state with the ancilla is measure in the state $|f\rangle\langle$. It is therefore evident that dephasing events do not significantly affect the cavity state, whereas a relaxation event, which does not commute with the interaction, dephases the cavity state.

Figure 7D:
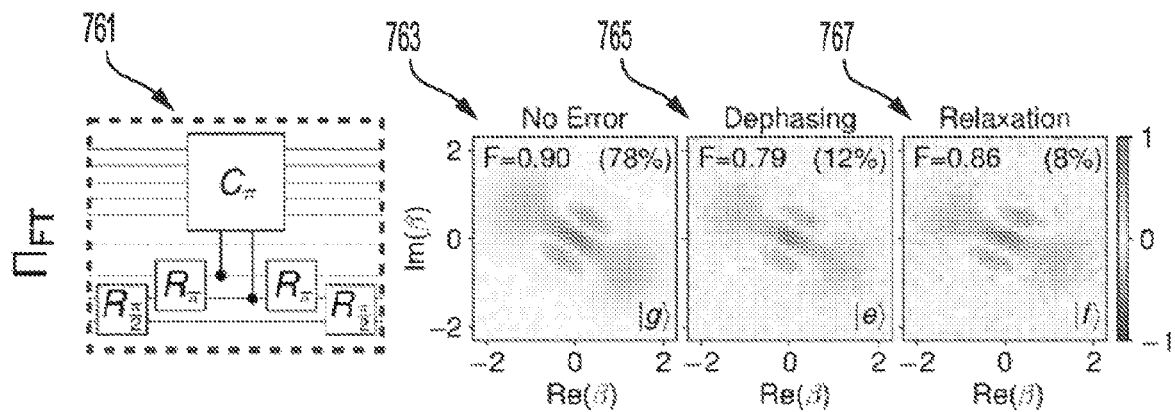
FIG. 7D illustrates a fault-tolerant parity mapping protocol and resulting Wigner tomograms, according to some embodiments.

In FIG. 7D, the fault-tolerant parity mapping $\Pi_{FT}$ 761 is performed. In addition to the sequence of the $\Pi_{gf}$ protocol, the sideband drive is also applied so that 4=0 in the time period between the two e-f it-pulses. The plot 763 shows the resulting Wigner tomogram for the state with the ancilla is measure in the state $|g\rangle\langle$. The plot 765 shows the resulting Wigner tomogram for the state with the ancilla is measure in the state $|e\rangle\langle$. The plot 767 shows the resulting Wigner tomogram for the state with the ancilla is measure in the state $|f\rangle\langle$. In this case, the cavity coherence is maintained even in the case of ancilla relaxation. The modest increase in the prevalence of dephasing events is a result of a slightly degraded ancilla dephasing rate in the presence of the strong drive.

In FIGS. 7B-C, the prevalence of each outcome is indicated as a percentage in the top right of each Wigner tomogram. Additionally, a state fidelity F (shown in the top left of each Wigner tomogram) is given, each with statistical error smaller than 0.01. From comparing the three types of parity measurements, only the FT parity measurement $\Pi_{FT}$, for which $\chi_{fe}=0$, results in the logical qubit being preserved for every possible ancilla outcome.

Figure 8A:
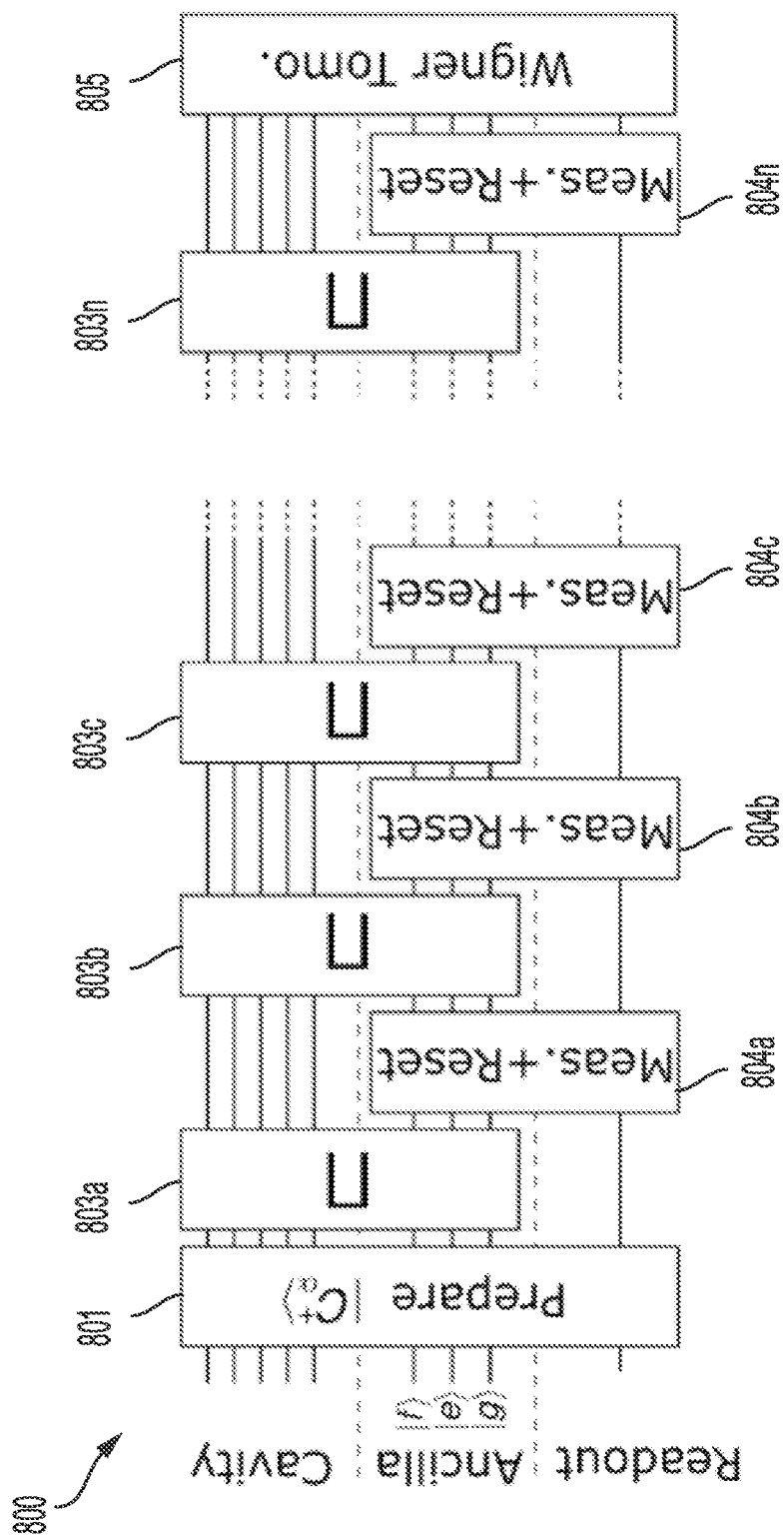
FIG. 8A is a quantum circuit diagram of a repeated parity syndrome measurement protocol, according to some embodiments.

Ultimately, in an error-correction setting, the parity of the logical qubit must be repeatedly measured. In order to demonstrate the advantage supplied by the fault-tolerant parity measurement in this context, the protocol illustrate in FIG. 8A is used (which is similar to that discussed in connection with FIG. 7A), where the three types of parity measurement are used a variable number of times, and the final state fidelity is determined as a function of the number of measurements. Trajectories in which a parity jump occurs are excluded, in order to emphasize uncorrectable errors. With an exponential fit, we can assign a characteristic number of measurements (No) in which the cavity fidelity decays.

FIG. 8A is a quantum circuit diagram 800 illustrating the protocol according to some embodiments. The protocol is a repeated parity syndrome measurement. An even Schrödinger cat state with mean photon number two is prepared 801 in the cavity. The photon-number parity is mapped 703*a* onto the ancilla in one of three different ways as outlined above. A measurement and reset 804*a* is performed. The photon-number parity mapping may be repeated a number (n) of times (803*b*, 803*c*, . . . 803*n*) and the measurement and reset operations may also be repeated a number (n) of time (804*b*, 804*c*, . . . 803(*n*)). Finally, Wigner tomography 805 is performed on the cavity in order to determine the fidelity of the final cavity state conditioned on the outcome of the first parity measurement.

Figure 8B:
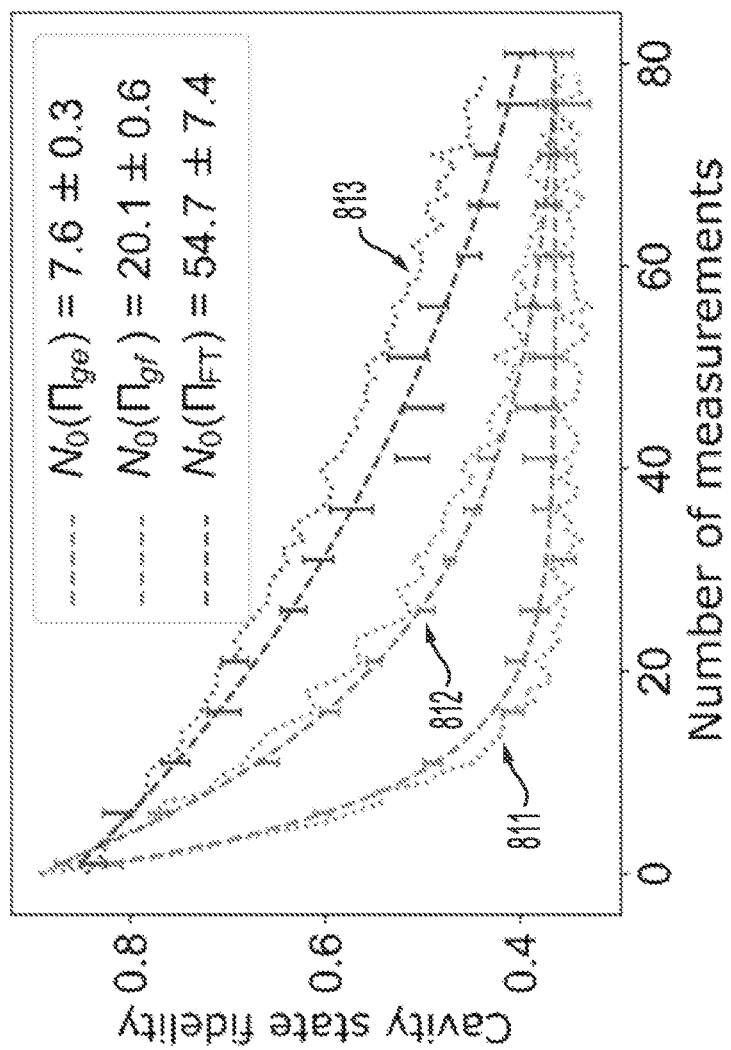
FIG. 8B is a plot of cavity state fidelity as a function of the number of measurements made in the protocol of FIG. 8A, according to some embodiments.

FIG. 8B is a plot illustrating the cavity state fidelity as a function of the number of parity measurements made for the three types of parity measurement outlined in FIG. 7B-D. The $\Pi_{ge}$ parity measurement is represented by the plot 811; the $\Pi_{gf}$ parity measurement is represented by the plot 812; and the $\Pi_{FT}$ parity measurement is represented by the plot 813. The dotted lines are simulated fidelities extracted from Monte-Carlo trajectories, the dashed lines are exponential fits to the data points.

From FIG. 8B, it can be seen that $N_0(\Pi_{gf})/N_0(\Pi_{ge})$ $\gamma 2.6 \pm 0.2$, showing that even without sideband drive, the $\Pi_{gf}$ protocol offers some advantages compared to $\Pi_{ge}$. The first reason is that the probability of relaxation is lower for $\Pi_{gf}$, since the relaxation time of $|f\rangle\langle|$ (24 µs) is nearly that of $|e\rangle\langle|$ (26 µs), while the parity measurement time of $\Pi_{gf}$ is less than half that of $\Pi_{ge}$. The second reason is that the cavity is less dephased given that an ancilla relaxation event occurred, since the cavity angle is distributed between 0 and $\pi \chi_{fe}/\chi_{fg} \approx 0.6\pi$ (As evident from the residual coherence after a relaxation event in FIG. 7C). The fault-tolerant implementation improves on $\Pi_{gf}$ by a factor of $2.7 \pm 0.4$, resulting in a total fault-tolerance gain of $N_0(\Pi_{FT})/N_0(\Pi_{ge}) \approx 7.2 \pm 1$. Monte-Carlo simulations of how the cavity phase distribution is affected by these factors produce fidelity decay curves which are in good agreement with the observed results. The remaining error is mostly attributable to either excitation during the parity map or decay during the ancilla readout.

Thus, based on the above, some embodiments include a parity check syndrome measurement of a logical qubit that is protected against all first-order ancilla errors, yielding a fault-tolerance gain of 7.2 compared to the non-fault-tolerant measurement. The type of fault tolerance achieved is different from, and in some sense more desirable, than traditional fault-tolerant schemes. In general, ancilla errors are allowed to propagate to the logical qubit, as long as the resulting error can be undone by an additional round of error correction. However, by using an error-transparent interaction between the ancilla and the logical qubit, the propagation of ancilla errors is prevented altogether. In addition, the syndrome measurement is also transparent to photon loss, and is therefore fully compatible with the cat-code error correction scheme. The presented scheme is readily extendable to higher orders of fault-tolerant protection. For instance, by using four instead of three ancilla levels, we can protect against relaxation errors up to second order, or alternatively against both relaxation and thermal excitations to first order. We envision the hardware-efficient approach to fault-tolerance presented in this work to become an important tool for fully harnessing the potential benefits of quantum error correction.

The system parameters for a particular example device used to acquire some of the data used herein are shown in Table 1.

TABLE 1

System Parameters

| Description | Hamiltonian/ Lindblad Term | Measured value |
|---|---|---|
| Cavity Frequency | $\omega_c \hat{a}^\dagger \hat{a}$ | $\omega_c = 2\pi \times 4.5$ GHz |
| Transmon g-e frequency | $\omega_q |e\rangle\langle e|$ | $\omega_q \approx 2\pi \times 6.5$ GHz |
| Readout resonator frequency | $\omega_{RO} \hat{r}^\dagger \hat{r}$ | $\omega_{RO} \approx 2\pi \times 9.3$ GHz |
| Transmon anharmonicity | $(2\omega_q + \alpha) |f\rangle\langle f|$ | $\alpha \approx 2\pi \times -210$ MHz |
| Cavity Self-Kerr | $\frac{K}{2} \hat{a}^\dagger \hat{a}^\dagger \hat{a} \hat{a}$ | $K \approx 2\pi \times -10$ Hz |
| Transmon-Readout Cross-Kerr | $\chi_{RO} \hat{r}^\dagger \hat{r} |e\rangle\langle e|$ | $\chi_{RO} \approx 2\pi \times -1.3$ MHz |
| Transmon-Cavity Cross-Kerr | $(\chi_e |e\rangle\langle e| + \chi_f |f\rangle\langle f|) \hat{a}^\dagger \hat{a}$ | $\chi_e = 2\pi \times -93$ kHz, $\chi_f = 2\pi \times -236$ kHz |
| Cavity-Readout Cross-Kerr | $\chi_{ra} \hat{r}^\dagger \hat{r} \hat{a}^\dagger \hat{a}$ | $\chi_{ra} = 2\pi \times -0.4$ kHz |
| Cavity Photon Loss | $\frac{1}{T_1^c} D[\hat{a}]$ | $T_1^c \approx 1.07$ ms |
| Transmon $|e\rangle$ to $|g\rangle$ decay | $\frac{1}{T_1^{eg}} D[|g\rangle\langle e|]$ | $T_1^{eg} \approx 25$ µs |
| Transmon $|f\rangle$ to $|e\rangle$ decay | $\frac{1}{T_1^{fe}} D[|e\rangle\langle f|]$ | $T_1^{fe} \approx 23$ µs |
| Transmon $|g\rangle$ dephasing time | $\frac{1}{T_\phi^g} D[|g\rangle\langle g|]$ | $T_\phi^g \approx 81$ µs |
| Transmon $|e\rangle$ dephasing time | $\frac{1}{T_\phi^e} D[|e\rangle\langle e|]$ | $T_\phi^e \approx 17$ µs |
| Transmon $|f\rangle$ dephasing time | $\frac{1}{T_\phi^f} D[|f\rangle\langle f|]$ | $T_\phi^f \approx 12$ µs |
| Transmon thermal population | $\frac{\bar{n}_{th}^e}{T_1^{eg}} D[|e\rangle\langle g|]$ | $\bar{n}_{th}^e \approx 0.02\text{-}0.03$ |

While the above has focused on error correction and performing fault tolerant measurements. The same sideband driving technique may be extended to other quantum operations, such as quantum logic gates. Three such fault tolerant quantum logic gates are described below: a controlled-SWAP (c-SWAP) gate; an exponential-SWAP (e-SWAP) gate; and a selective number-dependent arbitrary phase (SNAP) gate.

The c-SWAP and e-SWAP gates are gates that swap the photonic state of two cavities. Thus the quantum information system used to implement such gates is a modified version of that shown in FIG. 1B and includes two cavities, two ancilla transmons and a coupling transmon.

Figure 9:
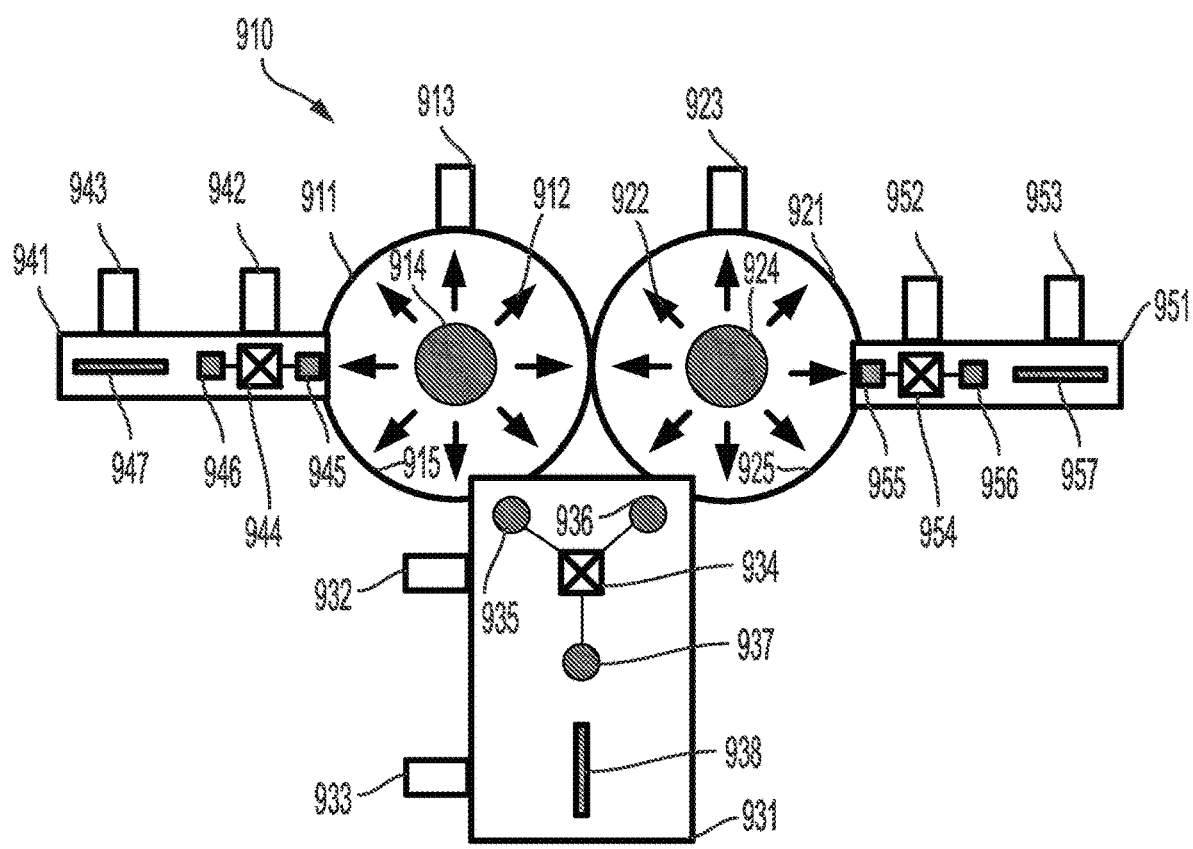
FIG. 9 is a schematic diagram of a quantum information system according to some embodiments.

FIG. 9 illustrates a quantum information system 910 used to implement a c-SWAP and/or e-SWAP gate. The system 910 includes a first three-dimensional (3D) cavity 911, a second 3D cavity 921, a coupling device 931, a first ancilla device 941, and a second ancilla device 951.

The first and second 3D cavities 911 and 912 acts as a 3D version of a λ/4 transmission line resonator between a central stubs 914 and 924, respectively, and outer walls 915 and 925, respectively. For example, the diameter of central stubs 914 and 924 may be 3.2 mm and the diameter of the outer walls 915 and 925 may be 9.5 mm. It is noted, however, that embodiments are not limited to any particular dimensions. The resonant frequency of each of the cavities 901 and 902 may be determined by the height of the central stub 914 and 924 within their respective cavity. For example the central stub 914 may have a height of 4.8 mm and the second central stub 924 may have a height of 5.6 mm. The first 3D cavity 911 supports microwave radiation 912 of a first frequency and the second 3D cavity 921 supports microwave radiation 922 of a second frequency that is different from the first frequency. In some embodiments, the first cavity 911 and the second cavity 921 include ports 913 and 923, respectively, through which microwave radiation from the microwave source 906 may be applied. Applying microwave radiation to a cavity may, for example, implement a displacement operation on the quantum state of the cavity.

The coupling device 931 includes a coupling transmon 934 that provides a nonlinear interaction between the first cavity 911 and the second cavity 921. The transmon 934 is coupled to a first antenna 935 that is inserted at least partially into the first cavity 911 and a second antenna 936 that is inserted at least partially into the second cavity 921 such that at least a portion of each antenna protrudes into its respective cavity. The first and second antennas 935/936 may be, for example, circular pads that provide capacitive coupling to the first and second cavities 911/921, respectively.

The coupling device 931 also includes a resonator 938 that provides the ability to readout the state of the transmon 934. A third antenna 937 couples the resonator 938 to the resonator 938. In some embodiments, the resonator 938 is a quasi-planar resonator with a lower Q value than either the first cavity 911 or the second cavity 921. In some embodiments, the transmon 934 and the resonator 934 are fabricated on a single sapphire substrate. A readout pulse of microwave radiation may be received by a pump port 932 and a resulting microwave signal may be received from readout port 933.

The nonlinearity of the transmon 934 of the coupling device 931 enables four wave mixing, which is used to perform a frequency-converting bilinear coupling between the first cavity 911 an the second cavity 921. The four-wave mixing is controlled by pumping the transmon 934 via a pump port 932 with microwave radiation that satisfies the frequency matching condition $\omega_1 - \omega_2 = \omega_{p2} = \omega_{p1}$, where $\omega_1$ is the resonant frequency of the first cavity 911, $\omega_2$ is the resonant frequency of the second cavity 921, $\omega_{p1}$ is the frequency of the first pump associated with a mode c, and $\omega_{p2}$ is the frequency of the second pump associated with a mode d. This coupling implements an effective time-dependent BS interaction between the cavity modes. As is known from conventional optics, the unitary evolution of the beam splitter is described by the unitary operator:

$$U_{BS}(\theta) = e^{-i\int_0^t H_{BS}(\tau)d\tau} = e^{i\theta(a^\dagger b + ab^\dagger)}, \quad (5)$$

where $$H_{BS}(\tau) = g(\tau)(a^\dagger b + ab^\dagger), \quad (6)$$

and $$\theta = \int_0^t g(\tau)d\tau. \quad (7)$$

For $\theta = \pi/2$, the beam splitter unitary operator implements the SWAP operation that exchanges the states between the two cavity modes associated with the annihilation operators a and b, respectively. For $\theta = \pi/4$ and $\theta = -\pi/4$ the unitary operator corresponds to a 50/50 beam splitter. Different from ordinary optics, the microwave cavity eigenmodes have different frequencies and do not couple to each other without a nonlinearity. However, the Josephson nonlinearity and additional parametric pumps can be used to compensate for the cavity frequency difference, so that modes with different frequencies can be coherently coupled. For example, based on the four-mode coupling $g_4 a^\dagger bc^\dagger d$+h.c. (where h.c. represents the Hermitian conjugate of the first term and $g_4$ is the four mode coupling constant) from the Josephson nonlinearity, the modes c and d may be pumped so that they can be approximated by classical coherent states with amplitudes $\langle c \rangle = A_c(\tau)$ and $\langle d \rangle = A_d(\tau)$, which leads to an effective beam-splitter coupling Hamiltonian in Eqn. (6) with $g(\tau) = g_4 A_c^*(\tau) A_d(\tau)$. Note that $g(\tau)$ may be tuned by controlling the amplitudes and phases of $A_c(\tau)$ and $A_d(\tau)$. In this way, some embodiments can easily switch on/off the beam-splitter coupling with extremely high on/off ratio. This is a distinct advantage over 'always-on' capacitive or other fixed couplings between qubits. In addition, by pumping modes c and d so that the sum of their frequencies is equal to the sum of the cavity mode frequencies, one can realize a bi-linear coupling of the form $H_S = f(\tau)a^\dagger b^\dagger + f^*(\tau)ab$. With these two operations one can perform any linear symplectic transformation between the two cavities.

In some embodiments, the above approach of implementing the unitary beam splitter operator using the Josephson non-linearity can be made robust against imperfections in the Josephson device. For example, if the intrinsic non-linearity of the device is weak but the parametric pumping is strong, the effect of thermal noise in modes c and d may be suppressed by the fact that this noise is small relative to the large coherent state amplitudes $A_c$ and $A_d$. Operation in this regime may also increases the linearity of the beam splitter so that SWAP operations can be carried out for quantum states containing a wide range of photon numbers.

The beam splitter unitary transformation is a very useful element for quantum information processing. For example, while evolution of a Gaussian input state (e.g., coherent states, squeezed states) acted upon by the beam splitter unitary operator can be efficiently simulated with a classical computer, evolution of a non-Gaussian input state (e.g., Fock states) may lead to non-trivial output states. For example, the complexity of boson sampling illustrates the non-trivial statistical properties of the output state which are hard to simulate with classical computers. Moreover, the beam splitter unitary combined with both single-photon sources and photon detectors can achieve universal linear optical quantum computation (LOQC), albeit with major challenges that include the probabilistic nature of entangling gates and extremely daunting resource overhead.

In some embodiments, rather than being restricted to linear optical quantum computing, additional nonlinear elements may be used to facilitate quantum information processing. For example, using the physical platform of superconducting circuits with microwave photons not only provides the capabilities of single-photon sources and photon detectors, but also includes at least one highly controllable transmon that can be used as two-level or multi-level ancillae. In some embodiments, quantum operations that combine the beam splitter unitary operator and cavity-transmon dispersive coupling gates are used to perform quantum information processing operations. In some embodiments, the dispersive coupling gates are still linear optics transformations that are controlled by (e.g., based upon and/or conditioned on) the quantum state of a transmon (or other) ancilla. This merging of the capabilities of linear optics and gate-based quantum computation is powerful and allows one to carry out gate operations on qubits logically encoded in photon states in a manner that is independent of the particular logical encoding. Thus, in some embodiments, the logical encoding of the information can be changed while using the same hardware with the same operations.

First ancilla device 941 is similar to the coupling device 931, but only couples to a the first cavity 911, not both cavities. The first ancilla device includes a pump port 942 for driving a transmon 944 with pump and readout pulses of microwave radiation and a readout port 943 for receiving readout microwave signals from the transmon 944. The transmon 944 is coupled to the first cavity 911 via a first antenna pad 945 that at least partially protrudes into the first cavity 911. A second antenna pad 946 couples the transmon 944 to a quasi-planar resonator 947.

The second ancilla device 951 is similar to the first ancilla device 941, but is coupled to only the second cavity 921, not the first cavity 911. The second ancilla device includes a pump port 952 for driving a transmon 954 with pump and readout pulses of microwave radiation and a readout port 953 for receiving readout microwave signals from the transmon 954. The transmon 954 is coupled to the first cavity 911 via a first antenna pad 955 that at least partially protrudes into the first cavity 911. A second antenna pad 956 couples the transmon 944 to a quasi-planar resonator 947.

The first and second ancilla devices 941 and 952 may be used to implement a CPS operation, which is represented as:

$$\text{CPS} = |g\rangle\langle g| \otimes I + |e\rangle\langle e| \otimes (-1)^{\hat{n}}, \qquad (8)$$

where $\hat{n} = a^\dagger a$ is the number operator of the bosonic mode of the particular cavity coupled with the transmon. In some embodiments, the phase shift is $\pi$ and resulting in the implementation of a controlled-Parity operation since the photon number parity operation is $\hat{P} = (-1)^{a^\dagger a}$. In some embodiments, the CPS gate can be obtained from the time evolution under the Hamiltonian with dispersive coupling between the ancilla transmon and the respective cavity $$H_{dis} = \hbar\chi|e\rangle\langle e|\otimes\hat{n} \qquad (9)$$

for a time duration $t = \pi/\chi$ and coupling strength $\chi$.

An example set of parameters for implementing the quantum information system 910 is as follows: the first cavity 911 may have a kerr/$2\pi$=2 kHz and $\omega_1/2\pi$=5.45 GHz; the second cavity 921 may have a kerr/$2\pi$=3 kHz and $\omega_2/2\pi$=6.55 GHz; the coupling device 931 may have $\alpha/2\pi$=74 MHz, $\omega/2\pi$=5.95 GHz, $\chi_{c1}/2\pi$=0.26 MHz, and $\chi_{c2}/2\pi$=0.32 MHz; the first ancilla transmon 941 may have $\alpha/2\pi$=180 MHz, $\omega/2\pi$=4.5 GHz, $\chi/2\pi$=0.76 MHz; and the second ancilla transmon 951 may have $\alpha/2\pi$=180 MHz, $\omega/2\pi$=5.0 GHz, $\chi/2\pi$=1.26 MHz.

In some embodiments, a c-SWAP gate may be implemented using a combination of BS operations and CPS operations. A c-SWAP gate operates on two cavity modes and one of the ancilla transmons, swapping the states of the two cavities based on the state of the ancilla transmon. The unitary c-SWAP operator can therefore be written as:

$$U_{cSWAP} = |g\rangle\langle g|\otimes I + |e\rangle\langle e|\otimes \text{SWAP}, \qquad (10)$$

where $|g\rangle\langle$ and $|e\rangle\langle$ represent the ground state and the first excited state of the ancilla transmon, respectively. Because $(\text{c-SWAP})^2 = I$, c-SWAP is reversible. The c-SWAP gate is sometimes called the Fredkin gate, which is universal for classical computation. For quantum computation, c-SWAP and single-qubit rotations form a set of quantum gates capable of universal computation.

Figure 10A:
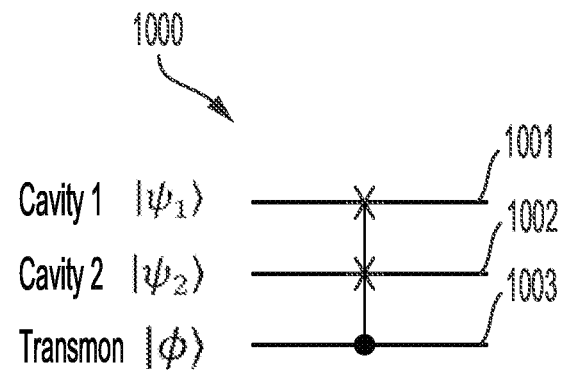
FIG. 10A is a schematic of a controlled-SWAP gate, according to some embodiments.

FIG. 10A illustrates a quantum circuit diagram 1000 for a c-SWAP gate. The lines 1001, 1002, and 1003 represent the first cavity 911, the second cavity 921 and an ancilla transmon 931. In quantum circuit diagrams, operations are performed on the various components as a function of time, from left to right. The symbol for the c-SWAP gate includes an "X" at each of the cavity lines 1001 and 1002 and a dot on the ancilla transmon line 1003.

Figure 10B:
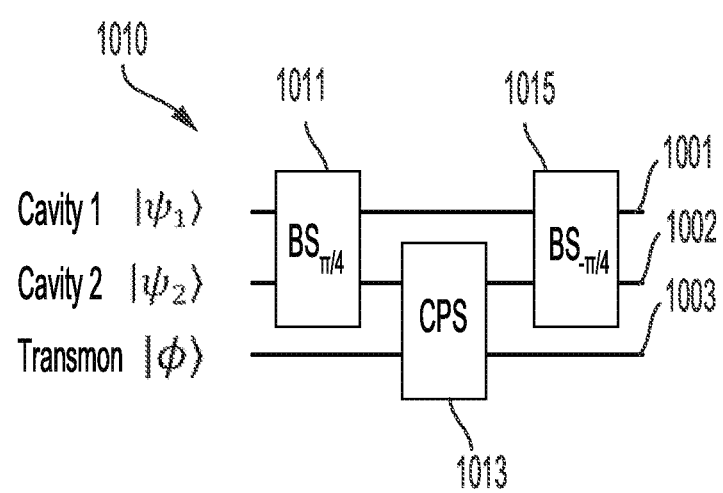
FIG. 10B is a schematic of a controlled-SWAP gate, according to some embodiments.

FIG. 10B illustrates an example quantum circuit diagram 1010 for implementing a c-SWAP gate using BS operations and CPS operations. First, a first BS operation 1011 with $\theta = \pi/4$ is performed between the first cavity 1001 and the second cavity 1002. As described above, the BS operation may be performed using the coupling transmon 934. After the first BS operation 1011, a CPS operation 1013 between the ancilla transmon 1003 and the second cavity 1002 is performed. Finally, a second BS operation 1015 with $\theta = -\pi/4$ is performed between the first cavity 1001 and the second cavity 1002.

In some embodiments, an e-SWAP operation may be performed using a combination of c-SWAP gates and ancilla transmon rotations. The e-SWAP operates on two cavities and is represented by the unitary operator:

$$U_{eSWAP}(\theta) = \exp[i\theta\text{SWAP}] = \cos\theta + i\sin\theta\text{SWAP}. \qquad (11)$$

For $\theta = \pi/2$, an e-SWAP gate is equivalent to a SWAP gate, where the resulting global phase shift (i) is non-observable. For $\theta = \pi/4$, $U_{eSWAP}(\pi/4) = 1/\sqrt{2}(I + i\text{SWAP})$ is a coherent combination of the identity operator and the SWAP operator, and is sometimes denoted as $\sqrt{\text{SWAP}}$. Single-qubit rotations and the $\sqrt{\text{SWAP}}$ operator operating on qubits form a set of universal quantum gates.

There are similarities and differences between the e-SWAP operator and the beam-splitter unitary operator. For the bosonic subspace with zero and one total excitations, the two are equivalent (e.g., $U_{BS}(\theta)|0_a, 1_b\rangle = \cos\theta|0_a, 1_b\rangle + i\sin\theta|1_a, 0_b\rangle = U_{eSWAP}(\theta)|0_a, 1_b\rangle$). However, for the subspace with more than one total excitations, the two operators behave differently (e.g., $U_{BS}(\theta)|1_a, 1_b\rangle = \cos 2\theta|1_a, 1_b\rangle + \dfrac{i}{\sqrt{2}}\sin 2\theta(|2_a, 0_b\rangle + |0_a, 2_b\rangle)$, which is distinct from $U_{eSWAP}(\theta)|1_a, 1_b\rangle = |1_a, 1_b\rangle$).

One feature of e-SWAP operator is that it preserves the logical subspace with respect to single-mode bosonic encodings that contain arbitrary numbers of bosons. For logical states of arbitrary single-mode bosonic encoding $|\varphi_1\rangle\langle$, $|\varphi_2\rangle\langle \in \mathcal{H}_c$, the e-SWAP operation $U_{eSWAP}(\theta)|\varphi_1\rangle\langle_a|\varphi_2\rangle\langle_b = \cos\theta|\varphi_1\rangle\langle_a|\varphi_2\rangle\langle_b + i\sin\theta|\varphi_2\rangle\langle_a|\varphi_1\rangle\langle_b$ preserves the code space for any bosonic codes and for any parameter $\theta$. This important property enables one to carry out quantum information processing with different choices of bosonic encoding using the same hardware. This powerful feature gives great flexibility to the hardware and allows experimentation with different encodings for quantum error correction via 'software updates' on fixed hardware.

Figure 11A:
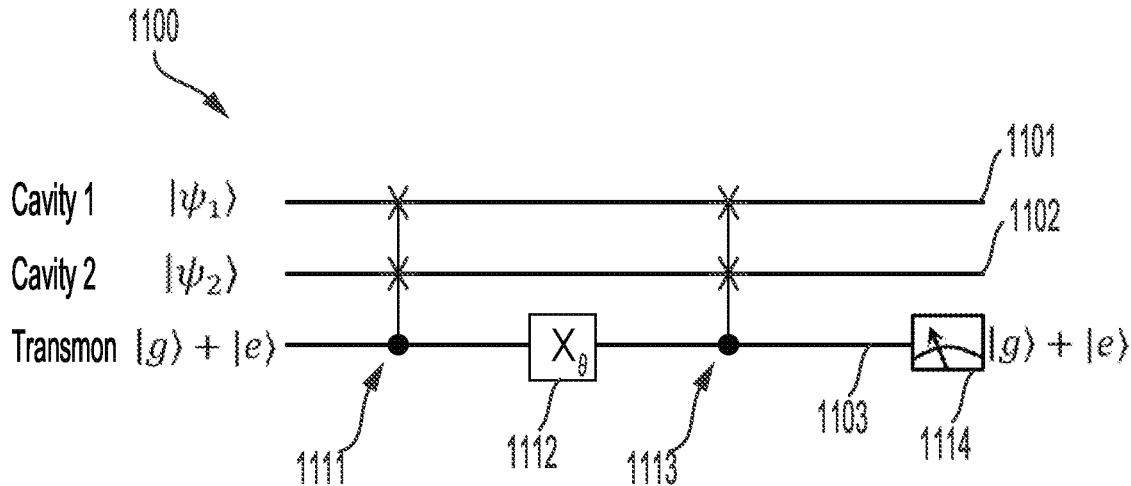
FIG. 11A is a schematic of an exponential-SWAP gate, according to some embodiments.

In some embodiments, the e-SWAP operator between two cavity modes can be implemented using a two-level ancilla transmon. For example, FIG. 11A is a quantum circuit diagram 1100 between a first cavity 1101, a second cavity 1102 and an ancilla transmon 1103. The illustrated method for implementing the e-SWAP operation is as follows: (1) initialize the ancilla transmon 1103 to the quantum state $|+\rangle\langle = 1/\sqrt{2}(|g\rangle\langle + |e\rangle\langle)$; (2) perform a first c-SWAP operation 1111 between the first cavity 1101 and the second cavity 1102 controlled based on the state of the ancilla transmon 1103; (3) rotate 1112 the ancilla transmon 1103 by angle $2\theta$ around the X axis $X_\theta = e^{i\theta\sigma_x}$; and (4) perform a second c-SWAP operation 1113 between the first cavity 1101 and the second cavity 1102 controlled based on the state of the ancilla transmon 1103. After the foregoing method, the ancilla transmon is restored to the initial state $|+\rangle\langle$ and decoupled from the two cavity modes; meanwhile, the two cavity modes undergo the e-SWAP operation, $U_{eSWAP}(\theta)$. If the ancilla transmon 1103 is measured 1114, the result, assuming no errors, is the initial state $|+\rangle\langle$).

Figure 11B:
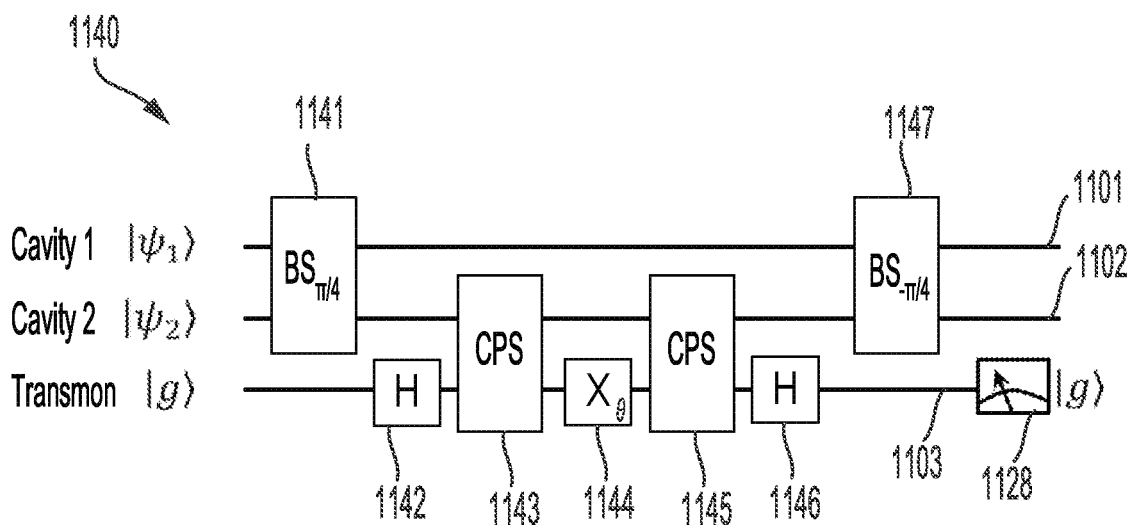
FIG. 11B is a schematic of an exponential-SWAP gate, according to some embodiments.

In some embodiments, a robust implementation of the e-SWAP operator can be obtained by decomposing the c-SWAP operators into beam splitter operators and CPS gates, as illustrated in FIG. 11B. The method of implementing the e-SWAP gate includes: (1) initializing the ancilla transmon 1103 to the quantum state $|g\rangle\langle$; (2) performing a first BS operation 1141 with $\theta=\pi/4$ between the first cavity 1101 and the second cavity 1102; (3) performing a first Hadamard operation 1142 on the ancilla transmon 1103; (4) performing a first CPS operation 1143 between the second cavity 1102 and the ancilla transmon 1103; (5) performing a rotation 1144 on the ancilla transmon 1103 by angle $2\theta$ around the X axis $X_\theta = e^{i\theta\sigma_x}$; (6) performing a second CPS operation 1145 between the second cavity 1102 and the ancilla transmon 1103; (7) performing a second Hadamard operation 1146 on the ancilla transmon 1103; (8) performing a second BS operation 1147 with $\theta=\pi/4$ between the first cavity 1101 and the second cavity 1102. If the ancilla transmon 1103 is measured 1148, the result, assuming no errors, is the initial state $|g\rangle\langle$.

In implementing the about c-SWAP and/or e-SWAP operations, the use of multiple ancilla states with sideband tuning can be used to make the gate robust, fault tolerant, and hardware efficient.

For example, first-order errors associated with spontaneous decay of the transmon state may be both heralded and corrected. In some embodiments, the cavity-transmon coupling Hamiltonian is altered to be "error transparent", so that the leading order error of transmon decay commutes with the error transparent Hamiltonian for all logical states of the cavities. The transmon decay that occurred during the evolution can then be identified as the transmon decay that occurred at the end of the evolution, which can significantly simplify the error analysis.

In some embodiments, four transmon levels ($|g\rangle\langle$, $|e\rangle\langle$, $|f\rangle\langle$, $|h\rangle\langle$) are used, where the $|g\rangle\langle$-$|h\rangle\langle$ subspace is used to encode a qubit of information, while the $|e\rangle\langle$-$|f\rangle\langle$, $|$subspace is used to detect errors. By introducing additional levels, the transmon decay error from the $|g\rangle\langle$-$|h\rangle\langle$ subspace can be characterized by the quantum channel $$\varepsilon(\rho)=\Sigma_{j=0,1,\ldots} K_j \rho K_j^\dagger, \quad (12)$$

where $K_0 = |g\rangle\langle g| + \sqrt{1-e^{-\gamma_1 t_{CPS}}}|h\rangle\langle h|$ and $K_1 = e^{-\gamma_1 t_{CPS}/2}|r\rangle\langle h|$. The subspace spanned by $|g\rangle\langle$-$|h\rangle\langle$ is used to encode the qubit, whereas the subspace spanned by $|e\rangle\langle$, $|f\rangle\langle$, and $|h\rangle\langle$ has uniform strength of dispersive coupling with the cavity mode due to, for example, a sideband drive.

In some embodiments, a quantum circuit similar to the circuit shown in FIG. 11B is used, but the unitary operations are generalized to the four-level transmon. In some embodiments, controllable back-action to the cavity modes is controlled by engineering the dispersive coupling between the transmon and cavity $$H_{dis} = \hbar\chi(|e\rangle\langle e| + |h\rangle\langle h| + |f\rangle\langle f|)\otimes \hat{n}, \quad (13)$$

to have identical dispersive shift $\chi$ for states $|e\rangle\langle$, $|f\rangle\langle$, and $|h\rangle\langle$, so that the CPS gate is $$CPS = |g\rangle\langle g|\otimes I + (|e\rangle\langle e| + |f\rangle\langle f| + |h\rangle\langle h|)\otimes(-1)^{\hat{n}}. \quad (14)$$

In some embodiments, the unitary operator associated with a generalized Hadamard gate becomes $$H|g\rangle\langle = (|g\rangle\langle + |h\rangle\langle)/\sqrt{2}$$

$$H|h\rangle\langle = (|g\rangle\langle - |h\rangle\langle)/\sqrt{2}$$

$$H|e\rangle\langle = |e\rangle\langle$$

$$H|f\rangle\langle = |f\rangle\langle. \quad (15)$$

Thus, the Hadamard rotation is performed within the g-h subspace and acts trivially over the e-f subspace.

In some embodiments, the transmon rotation becomes $$X_\theta|g\rangle\langle = \cos\theta|g\rangle\langle + i\sin\theta|h\rangle\langle$$

$$X_\theta|h\rangle\langle = i\sin\theta|g\rangle\langle + \cos\theta|h\rangle\langle$$

$$X_\theta|e\rangle\langle = |f\rangle\langle$$

$$X_\theta = |e\rangle\langle = |e\rangle\langle, \quad (16)$$

which rotates within the g-h subspace and swaps states $|e\rangle\langle$ and $|f\rangle\langle$.

In some embodiments, the CPS operation becomes $$CPS|g\rangle\langle = |g\rangle\langle\otimes(+1)^{\hat{n}}$$

$$CPS|h\rangle\langle = |h\rangle\langle\otimes(-1)^{\hat{n}}$$

$$CPS|f\rangle\langle = |f\rangle\langle\otimes(-1)^{\hat{n}}$$

$$CPS|h\rangle\langle = |h\rangle\langle\otimes(-1)^{\hat{n}}. \quad (17)$$

With the above extended gates over the four-level transmon, it is possible to detect first-order transmon dephasing errors and correct first-order transmon decay errors.

Transmon decay during the first CPS operation 1143 results in measurement 1148 of $|h\rangle\langle$ for the transmon state, while the cavity modes continue to evolve under the CPS gate without error because the decay does not change the dispersive coupling. Transmon decay during the second CPS operation 1145 results in measurement of $|f\rangle\langle$ for the transmon state, while the cavity modes evolve as the desired $U_{eSWAP}(\theta)$. Because the transmon decay errors ($|h\rangle\langle$ and $|f\rangle\langle$ states associated with transmon decay during the first and second CPS gates, respectively) can be unambiguously distinguished, the first-order transmon decay errors during the CPS gates can be actively corrected in some embodiments.

Thus, a fault-tolerant c-SWAP and e-SWAP gate can be implemented in some embodiments.

In another embodiment, the additional levels and sideband drive can be used to implement a fault-tolerant SNAP gate. A SNAP gate is associated with the operator:

$$\hat{S}(\vec{\theta}) = \Pi_{n=0}^\infty \hat{S}_n(\theta_n) = \Sigma_{n=0}^\infty e^{i\theta n}|n\rangle\langle n| \quad (18)$$

In a cavity, the different Fock states of the cavity are each associated with different transition frequencies of the transmon. For example, the transition frequency of the qubit where there are no photons in the cavity is defined as 0 MHz of detuning (and equal to the ostensible qubit transition frequency, which may in some embodiments be between 5 GHz and 10 GHz). When the cavity includes a single photon, the transition frequency of the qubit is detuned by approximately 10 MHz; when the cavity includes two photons, the transition frequency of the qubit is detuned by approximately 17 MHz; when the cavity includes three photons, the transition frequency of the qubit is detuned by approximately 26 MHz; when the cavity includes four photons, the transition frequency of the qubit is detuned by approximately 34 MHz; and when the cavity includes five photons, the transition frequency of the qubit is detuned by approximately 43 MHz. This number-dependent detuning of the transition frequency can be approximated as an $n\chi$ detuning, where n is the excitation number of the cavity and $\chi$ is a detuning per photon number. For example, $\chi$ may be approximately 8.3 MHz.

Based on this number-dependent detuning of the transition frequency of the qubit, the qubit may be addressed selectively using driving pulses with narrow spectral widths and central frequencies tuned to match the detuned transition frequencies for a particular excitation number. For example, driving the qubit at a frequency with 10 MHz detuning will cause the quantum state of the cavity to change only if there is a single photon in the cavity. Thus, a SNAP gate may be applied to adjust the quantum phase of a particular Fock state of an oscillator by selecting the appropriate frequency to match the targeted state. A SNAP gate may also include multiple pulses each targeting different Fock states within the same signal; since each pulse may be of a different frequency, pulses may be combined into a single signal.

Figure 12:
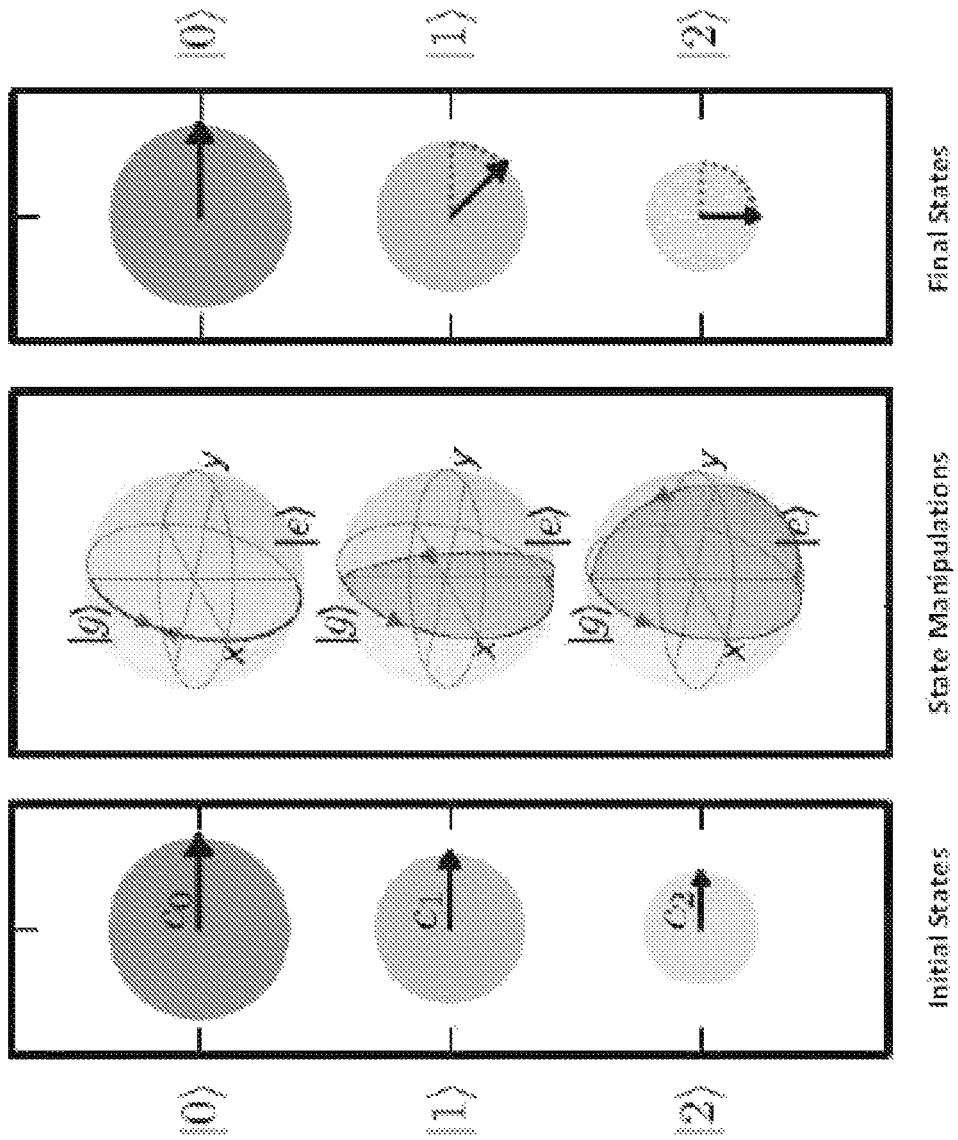
FIG. 12 illustrates the operation of a selective number-dependent arbitrary phase (SNAP) gate, according to some embodiments.

FIG. 12 depicts an illustrative process of manipulating states of a quantum mechanical oscillator, according to some embodiments. In FIG. 12, a SNAP gate that includes two pulses targeting the |1⟩⟨ and |2⟩⟨ Fock states of the oscillator is applied to a transmon qubit dispersively coupled to the oscillator. The area of each circle in the initial states represents the probability that a measurement of the oscillator would produce the associated measurement. For instance, a measurement of the oscillator would be more likely to measure the |0⟩⟨ state than the |1⟩⟨ state or the |2⟩⟨ state.

FIG. 12 is provided to illustrate the concept that two rotations performed upon the transmon that enclose a solid angle in the transmon qubit's Bloch sphere will impart a geometric phase to the coupled oscillator equal to the subtended angle. In the example of FIG. 12, two rotations are performed on the qubit by driving the qubit in a particular way. In this example, two pi-pulses (pulses causing a rotation of 7C radians around the Bloch sphere) are used to cause the state of the qubit to follow a trajectory on the Bloch sphere associated with each excitation number of the cavity. For example, the trajectory follows a first path on the Bloch sphere from |g⟩⟨ to |e⟩⟨ and then follows the same path on the Bloch sphere back from |e⟩⟨ to |g⟩⟨. Consequently, no solid angle is subtended by the trajectory and no geometric phase is introduced to the |0⟩⟨ component of the oscillator.

In contrast, the trajectory for the |1⟩⟨ state follows a first path on the Bloch sphere from |g⟩⟨ to |e⟩⟨ and the follows a second path on the Bloch sphere back from |e⟩⟨ to |g⟩⟨. Consequently, the trajectory subtends a first solid angle and, therefore, introduces a first geometric phase to the |1κ component of the cavity. The trajectory for |2⟩⟨ follows a first path on the Bloch sphere from |g⟩⟨ to |e⟩⟨ and the follows a second path on the Bloch sphere back from |e⟩⟨ to |g⟩⟨. Consequently, the trajectory subtends a second solid angle and, therefore, introduces a second geometric phase to the |2⟩⟨ component of the cavity. In some embodiments, the first solid angle is different from the second solid angle resulting in different geometric phases being introduced to each component of the oscillator. As shown, the solid angle subtended by trajectory for |2⟩⟨ is greater than that of trajectory for |1⟩⟨, and accordingly the phase imparted to the associated state of the oscillator is greater in the former case than in the latter.

In some embodiments, the first path of the trajectory the Bloch sphere and the second path of the trajectory on the Bloch sphere is generated using a pi-pulse. The exact path taken by the quantum state of the qubit may be dependent on the axis that the pi-pulse is applied. In this way, the first path and the second path can be made different, thereby causing the trajectory to subtend a solid angle on the Bloch sphere. Consequently, a geometric phase may be introduced into the quantum state of the qubit-oscillator system.

In some embodiments, the quantum state of the qubit during a SNAP gate begins and ends at the ground state, as illustrated by the trajectories. This type of trajectory may reduce the effects of relaxation and dephasing times on the quantum state of the oscillator before and/or after the SNAP gate is performed.

The right-most box of FIG. 12 illustrates the final state of each phasor after the introduction of the respective geometric phase. The phasor associated with n=0 undergoes no phase shift since no solid angle was subtended by the quantum state of the qubit. The phasor associated with n=1 acquires a first phase shift, illustrated by the dashed line. The phasor associated with n=2 acquires a second phase shift, illustrated by the dashed line. In some embodiments, the second phase shift is different from the first phase shift, e.g., the second phase shift is larger or smaller than the first phase shift.

Figure 13:
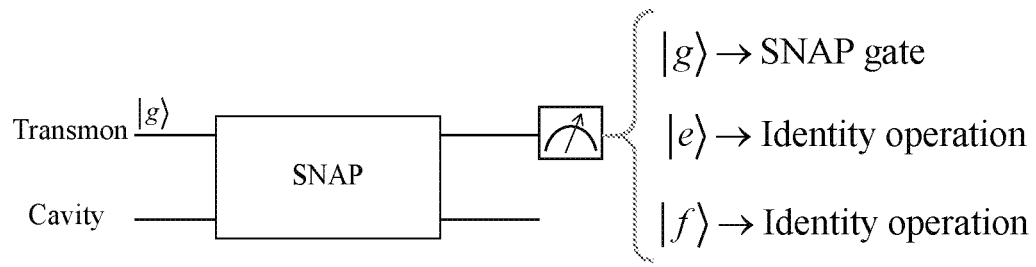
FIG. 13 is a schematic of the results of a implementing a fault-tolerant SNAP gate, according to some embodiments.

The aforementioned concepts of using three levels of the transmon (|g⟩⟨, |e⟩⟨, |f⟩⟨) applying a sideband drive to cancel the frequency shifts to make the SNAP gate error transparent may be used. Thus, if a transmon error occurs during the SNAP gate, the state of the cavity is not destroyed. FIG. 13 illustrates the results of such an implementation of a SNAP gate. When the ancilla transmon is measured after the fault-tolerant SNAP gate, if the ancilla is found in the state |g⟩⟨, then the SNAP gate was properly executed. An unexpected result of this implementation is that when the ancilla transmon is measured to be in either |e⟩⟨ (due to a bit flip error) or |f⟩⟨ (due to a phase error), the SNAP gate was not properly implemented, but instead the identity operator acted on the state of the cavity. Thus, not only are the errors heralded by the state of the ancilla, but the state of the cavity is completely unaffected when an error occurs. This makes the SNAP gate fully fault tolerant.

Figure 14:
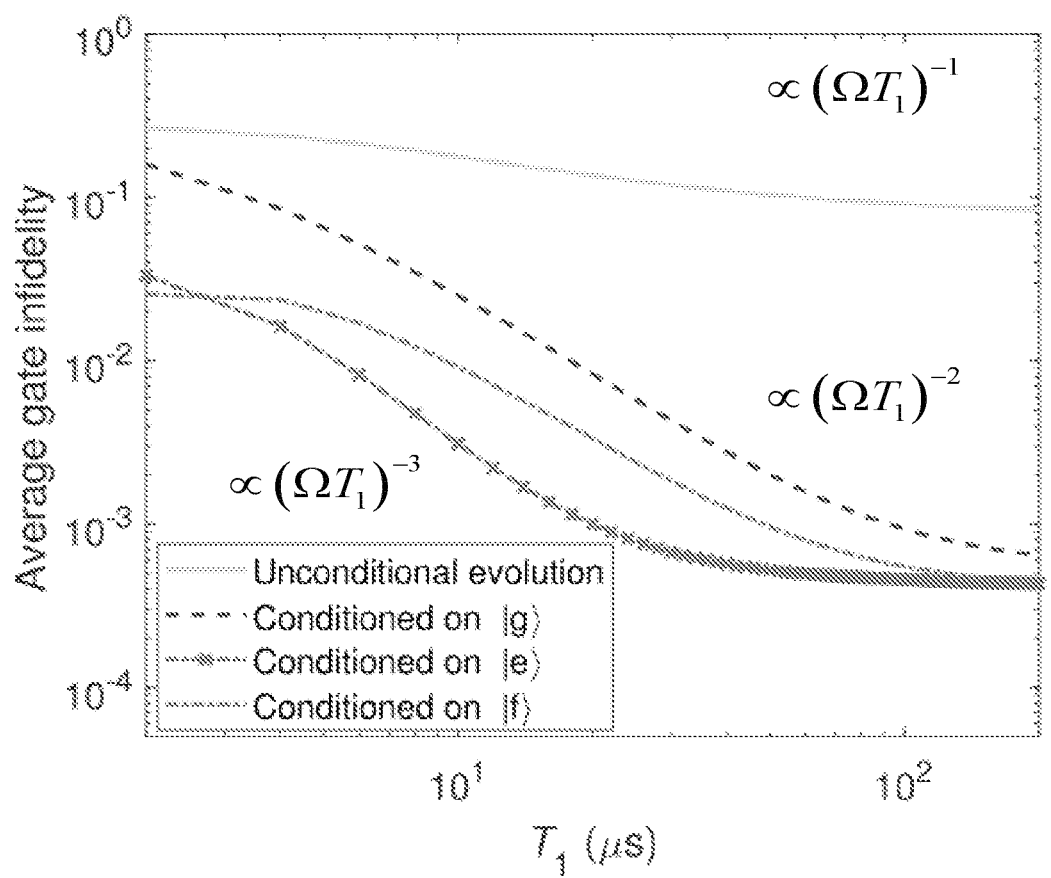
FIG. 14 is a plot of the average gate fidelity for a SNAP gate, according to some embodiments.

FIG. 14 is a plot of the average gate fidelity for a SNAP gate acting on a Fock state encoded logical qubit for the various outcomes that may result from measuring (or not measuring) the ancilla transmon.

The fault tolerant concept may be further extended to suppress dephasing errors of any order by using a d-level transmon with $\chi$ matching for the d−1 excited state can suppress the transmon relaxation error up to the (d−2)-order.

Having thus described several aspects and embodiments of the technology set forth in the disclosure, it is to be appreciated that various alterations, modifications, and improvements will readily occur to those skilled in the art. Such alterations, modifications, and improvements are intended to be within the spirit and scope of the technology described herein. For example, those of ordinary skill in the art will readily envision a variety of other means and/or structures for performing the function and/or obtaining the results and/or one or more of the advantages described herein, and each of such variations and/or modifications is deemed to be within the scope of the embodiments described herein. Those skilled in the art will recognize, or be able to ascertain using no more than routine experimentation, many equivalents to the specific embodiments described herein. It is, therefore, to be understood that the foregoing embodi- ments are presented by way of example only and that, within the scope of the appended claims and equivalents thereto, inventive embodiments may be practiced otherwise than as specifically described. In addition, any combination of two or more features, systems, articles, materials, kits, and/or methods described herein, if such features, systems, articles, materials, kits, and/or methods are not mutually inconsistent, is included within the scope of the present disclosure.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively.

What is claimed is:

1. A method for implementing a fault-tolerant quantum operation using a cavity and an ancilla transmon, the method comprising:
   encoding a logical qubit using more than two energy levels of the cavity;
   encoding information using more than two energy levels of the ancilla transmon; and
   creating an interaction between the cavity and the ancilla transmon that decouples at least one error type in the ancilla transmon from the cavity.

2. The method of claim 1, wherein creating the interaction between the cavity and the ancilla comprises applying a sideband drive.

3. The method of claim 2, wherein the evolution of the logical qubit of the cavity is transparent to first-order ancilla errors when the sideband drive is applied.

4. The method of claim 2, wherein the sideband drive is configured to:
   adjust a first frequency shift on the cavity by the ancilla transmon in a first excited state equal to a second frequency shift on the cavity by the ancilla transmon in a second excited state; and
   adjust a third frequency shift on the cavity by the ancilla transmon in a ground state excited state is equal to a second frequency shift on the cavity by the ancilla transmon in a second excited state.

5. The method of claim 1, wherein the quantum operation comprises a quantum logic gate.

6. The method of claim 5, wherein the quantum logic gate comprises a selective number-dependent arbitrary phase (SNAP) gate.

7. The method of claim 5, wherein the quantum logic gate comprises a controlled-SWAP gate.

8. The method of claim 5, wherein the quantum logic gate comprises an exponential-SWAP gate.

9. The method of claim 5, wherein, when an error occurs in the transmon, the logical qubit of the cavity is unaffected.

10. The method of claim 1, wherein the quantum operation comprises a quantum measurement.

11. The method of claim 10, wherein the quantum measurement comprises a quantum parity measurement.

12. The method of claim 10, wherein the quantum measurement comprises a measurement of an error syndrome.

13. The method of claim 1, wherein the quantum operation comprises a quantum parity measurement and/or a measurement of an error syndrome.

14. A quantum information system comprising:
   a cavity configured to support microwave radiation;
   an ancilla transmon dispersively coupled to the cavity;
   a microwave source configured to:
   apply microwave radiation to the cavity to encode a logical qubit using more than two energy levels of the cavity;
   apply microwave radiation to the ancilla transmon to encode information using more than two energy levels of the ancilla transmon; and apply microwave radiation to create an interaction between the cavity and the ancilla transmon that decouples at least one error type in the ancilla transmon from the cavity.

15. The quantum information system of claim 14, wherein applying microwave radiation to create an interaction between the cavity and the ancilla transmon comprises applying a sideband drive.

16. The quantum information system of claim 1, wherein the evolution of the logical qubit of the cavity is transparent to first-order ancilla errors when the sideband drive is applied.

17. The quantum information system of claim 15, wherein the sideband drive is configured to:
   adjust a first frequency shift on the cavity by the ancilla transmon in a first excited state equal to a second frequency shift on the cavity by the ancilla transmon in a second excited state; and
   adjust a third frequency shift on the cavity by the ancilla transmon in a ground state excited state is equal to a second frequency shift on the cavity by the ancilla transmon in a second excited state.

18. The quantum information system of claim 14, wherein the quantum operation comprises a quantum logic gate.

19. The quantum information system of claim 18, wherein the quantum logic gate comprises a selective number-dependent arbitrary phase (SNAP) gate, a controlled-SWAP gate, or an exponential-SWAP gate.

20. The quantum information system of claim 18, wherein, when an error occurs in the transmon, the logical qubit of the cavity is unaffected.

\* \* \* \* \*

UNITED STATES PATENT AND TRADEMARK OFFICE
CERTIFICATE OF CORRECTION

| | |
|---|---|
| PATENT NO. | : 11,449,384 B2 |
| APPLICATION NO. | : 16/959251 |
| DATED | : September 20, 2022 |
| INVENTOR(S) | : Serge Rosenblum et al. |

It is certified that error appears in the above-identified patent and that said Letters Patent is hereby corrected as shown below:

In the Claims

In Claim 16, at Column 27, Line 9:
"The quantum information system of claim 1, wherein"
Should read:
-- The quantum information system of claim 15, wherein --

Signed and Sealed this
Thirteenth Day of December, 2022

Katherine Kelly Vidal
*Director of the United States Patent and Trademark Office*